(12) United States Patent
Hayashi et al.

(10) Patent No.: US 8,237,092 B2
(45) Date of Patent: Aug. 7, 2012

(54) APPARATUS AND METHOD FOR HEATING SUBSTRATE AND COATING AND DEVELOPING SYSTEM

(75) Inventors: Shinichi Hayashi, Koshi-Machi (JP); Tetsuo Fukuoka, Koshi-Machi (JP); Tetsuya Oda, Koshi-Machi (JP); Hiroaki Inadomi, Koshi-Machi (JP)

(73) Assignee: Tokyo Electron Limited, Tokyo (JP)

( * ) Notice: Subject to any disclaimer, the term of this patent is extended or adjusted under 35 U.S.C. 154(b) by 125 days.

(21) Appl. No.: 12/880,716

(22) Filed: Sep. 13, 2010

(65) Prior Publication Data

US 2010/0330815 A1 Dec. 30, 2010

Related U.S. Application Data

(62) Division of application No. 11/205,150, filed on Aug. 17, 2005, now Pat. No. 7,812,285.

(30) Foreign Application Priority Data

Apr. 19, 2005 (JP) ................................ 2005-121267

(51) Int. Cl.
*F27B 5/14* (2006.01)
*C23C 16/00* (2006.01)
(52) U.S. Cl. ........................................ 219/390; 118/725
(58) Field of Classification Search .................. 219/390, 219/385–389; 126/19, 20, 20.1, 20.2, 21, 126/22; 118/724, 725, 726
See application file for complete search history.

(56) References Cited

U.S. PATENT DOCUMENTS

| | | | |
|---|---|---|---|
| 5,374,382 A | 12/1994 | Nishiwaki et al. | |
| 6,322,631 B1 | 11/2001 | Okase | |
| 6,454,472 B1 | 9/2002 | Kim et al. | |
| 6,786,974 B2 | 9/2004 | Komiya et al. | |
| 7,432,476 B2 | 10/2008 | Morita et al. | |
| 7,812,285 B2 * | 10/2010 | Hayashi et al. | 219/390 |
| 8,080,765 B2 * | 12/2011 | Hayashi et al. | 219/390 |
| 8,102,652 B2 * | 1/2012 | Toh et al. | 361/699 |
| 2003/0186517 A1 | 10/2003 | Takagi | |
| 2004/0163599 A1 | 8/2004 | Hayashide et al. | |

FOREIGN PATENT DOCUMENTS

| | | |
|---|---|---|
| JP | 01-241124 | 9/1989 |
| JP | 4-147612 | 5/1992 |
| JP | 8-45817 | 2/1996 |
| JP | 08-045817 | 2/1996 |
| JP | 2000-21733 | 1/2000 |
| JP | 2000-124106 | 4/2000 |
| JP | 2001-176792 | 6/2001 |

(Continued)

OTHER PUBLICATIONS

Japanese Office Action issued Oct. 14, 2009 for Japanese Application No. 2005-121267 w/ English language translation.

(Continued)

*Primary Examiner* — Daniel L Robinson
(74) *Attorney, Agent, or Firm* — Smith, Gambrell & Russell, LLP

(57) ABSTRACT

A substrate heating apparatus includes a top plate arranged above a hot plate so that a vertical space is formed between the hot plate and the top plate. The top plate has an evacuated internal chamber serving as a vacuum insulating layer that suppresses heat transfer from a first surface of the top plate facing the hot plate to a second surface of the top plate opposite to the first surface. When heating the substrate, a gas flow flowing through the space between the hot plate and the top plate is generated.

10 Claims, 18 Drawing Sheets

FOREIGN PATENT DOCUMENTS

| | | |
|---|---|---|
| JP | 2001-244271 | 9/2001 |
| JP | 2002-203778 | 7/2002 |
| JP | 2002-246305 | 8/2002 |
| JP | 2004-128249 | 4/2004 |
| JP | 2004-214696 | 7/2004 |
| JP | 2005-45249 | 2/2005 |
| JP | 2005-64242 | 3/2005 |

OTHER PUBLICATIONS

"Regarding duty to disclose information to the USPTO" dated Jul. 26, 2010 (4 pages).

Japanese Office Action issued on Oct. 27, 2011 for Application No. 2009-287783 with English translation.

* cited by examiner

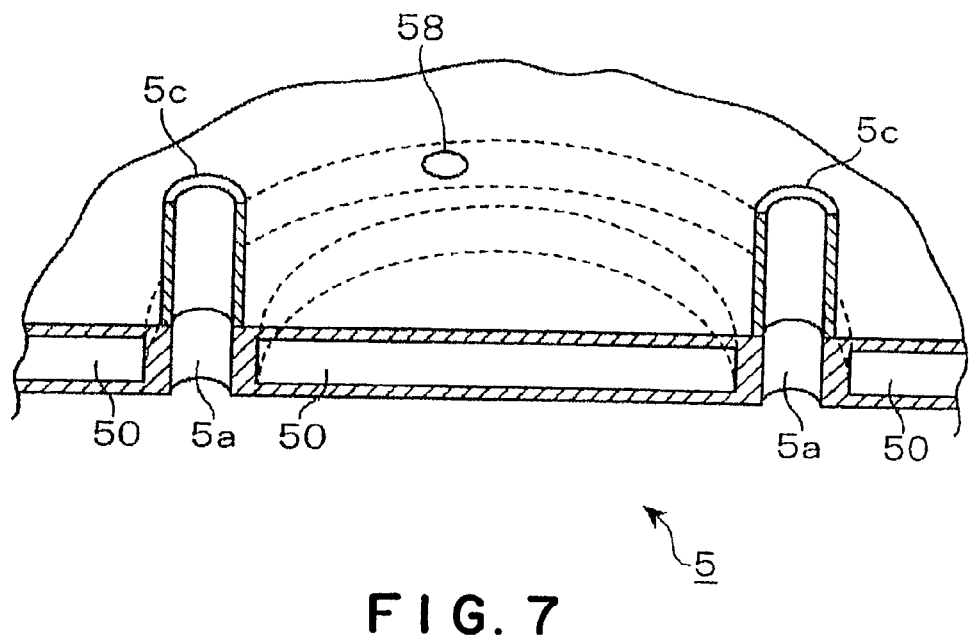
F I G. 7
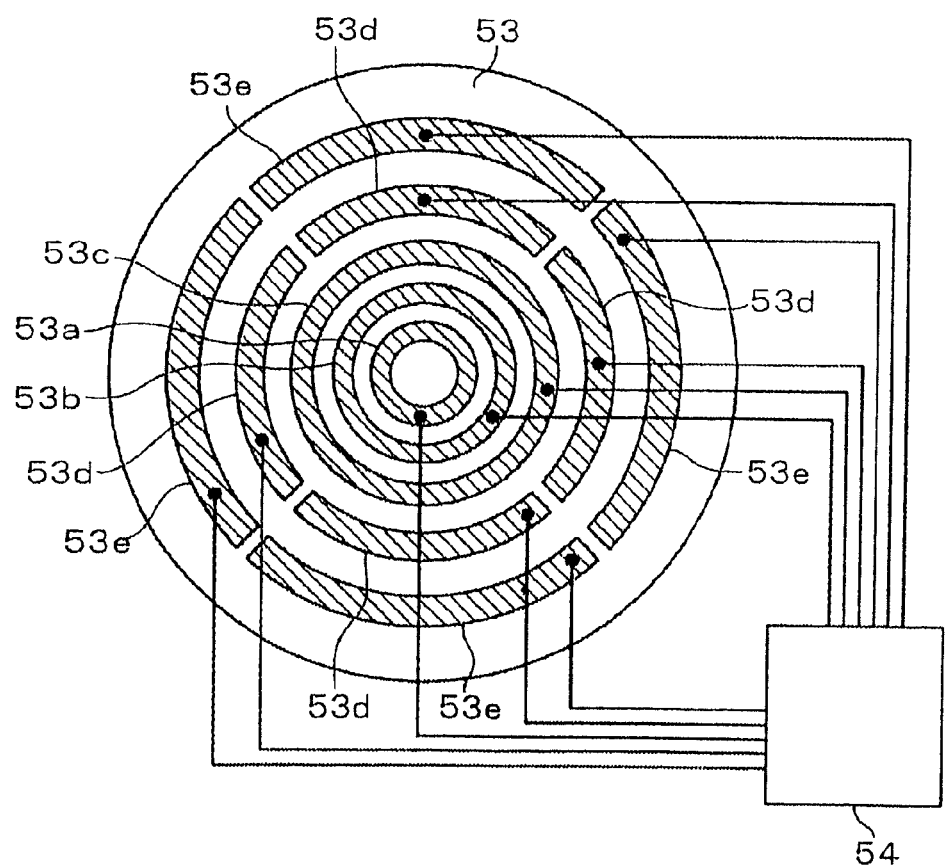
F I G. 8

APPARATUS AND METHOD FOR HEATING SUBSTRATE AND COATING AND DEVELOPING SYSTEM

CROSS REFERENCE TO RELATED APPLICATION

This application is a division of Ser. No. 11/205,150 filed Aug. 17, 2005, which is being incorporated in its entirety herein by reference.

BACKGROUND OF THE INVENTION

1. Field of the Invention

The present invention relates to an apparatus and method for heating a substrate, and a coating and developing system employing the heating apparatus.

2. Description of the Related Art

A known coating and developing system coats a substrate (e.g., a semiconductor wafer, or a glass substrate for a liquid crystal display) with a resist solution and develops an exposed resist, in order to form a resist pattern on the substrate. Such a coating and developing system employs a heating apparatus that is generally called "baking apparatus". The baking apparatus heats a wafer coated with a resist solution to vaporize a solvent contained in a resist solution to dry the resist solution.

FIG. 18 shows the structure of a heating apparatus in one example. Reference numeral 10 denotes a casing, and reference numeral 10a denotes a wafer delivery port. Reference numeral 11 denotes a base, and reference numeral 12 denotes a cooling plate for cooling a wafer adapted to move toward a hot plate 12a. Drive mechanisms 13 and 14 are arranged in a space below the base 11 to vertically move pins 13a and 14a, respectively. The vertical movement of the pins 13a by the drive mechanism 13 allows a wafer to be transferred between the cooling plate 12 and a not shown wafer conveyer that enters the casing 10 through the wafer delivery port 10a. The vertical movement of the pins 14a by the drive mechanism 14 allows a wafer to be transferred between the cooling plate 12 and the hot plate 12a. The drive mechanism 14 is arranged outside an area right below the hot plate 12a in order to avoid deterioration of the drive mechanism due to thermal radiation emitted from the hot plate 12a. JP1-242124A discloses such an arrangement of the drive mechanism, for example. In FIG. 18, reference numeral 15 denotes a top plate, which moves vertically by a drive mechanism 15a and functions as a cap or a cover. Reference numeral 16 denotes an area in which electric components for operating the drive mechanism 15a are installed.

When a wafer W is placed on the hot plate 12a, the top plate 15, which serves as a flow guide and is arranged above the base 11, descends to contact closely to the peripheral portion of the base via an O-ring 15b to define a sealed space around the wafer W. Thereafter, a gas supply unit 17a supplies a gas into the sealed space through a circumferentially-arrayed, gas supply ports 17, while a suctioning unit 18a evacuates the sealed space through a suctioning port 18 arranged at the central portion of the top plate 15. Thereby, the wafer is heated while the gas flows from the peripheral portion towards the central portion of the wafer W.

The aim of defining the sealed space around the wafer W is to keep the lower surface of the top plate 15 at a certain high temperature. If the temperature of the lower surface of the top plate 15 is lowered, the main flow of the gas is disturbed by local updraft and/or downdraft generated due to temperature difference between the hot plate 12a (or wafer W) and the top plate 15, resulting in deterioration of in-plane temperature uniformity of the wafer W. If such a disturbed flow occurs, sublimed resist components are likely to be adhered to the top plate 15, and thereafter possibly fall onto the wafer W to contaminate the same.

The heating apparatus of FIG. 19 with the movable top plate 15 must be provided with a driving mechanism for the top plate 15, and thus is large-sized and has a complicated structure. Moreover, if sublimed components are adhered to the top plate 15, the sublimed components may possibly fall onto the wafer due to the vibrations generated by the vertical movement of the top plate 15, resulting in contamination of the wafer W.

In order to achieve in-plane uniformity of a heat treatment without using a vertically-movable top plate, a possible solution is the provision of a heater in the top plate for heating the lower surface thereof.

In some cases, such a heating apparatus heats wafers of different process lots at different temperature. For example, the process temperature of wafers of a first lot is 150° C., and the process temperature of wafers of a second lot is 130° C. In this case, the top plate must be cooled after the completion of the process of first-lot wafers, in order to prevent the second-lot wafers from being heated at an excessive high temperature. However, the top plate provided with a heater has a high heat capacity, and thus a considerable long time is required to cool the top plate, resulting in a reduced throughput of the heating apparatus.

JP8-45817A discloses a baking apparatus for baking a substrate coated with a chemical amplification resist after exposure. When the substrate is baked in the baking chamber, the chamber is filled with an inert gas. The baking chamber is defined by heat-insulating walls each having a vacuum insulating layer, which stabilizes the temperature in the baking chamber to achieve a desired diffusing condition of an acid component produced in the resist by baking the resist. The apparatus of JP8-45817A differs from the apparatus of FIG. 19 in that the former does not employ a gas flow to promote the baking treatment of the resist. JP8-45817 does not provide any solution to the foregoing problems associated with the apparatus of FIG. 19.

SUMMARY OF THE INVENTION

The present invention has been made in view of the foregoing problems, and therefore the object of the present invention is to provide an apparatus and method for heating a substrate that can perform a heat treatment with a high in-plane uniformity, without using a vertically movable top plate.

In order to achieve the above objective, the present invention provides a substrate heating apparatus including: a hot plate adapted to heat a substrate coated with a coating solution while supporting the substrate thereon; a top plate arranged above the hot plate so that a vertical space is formed between the hot plate and the top plate, the top plate having an evacuated internal chamber serving as a vacuum insulating layer that suppresses heat transfer from a first surface of the top plate facing the hot plate to a second surface of the top plate opposite to the first surface; and means for generating a gas flow flowing through the space between the hot plate and the top plate.

In one preferred embodiment, the gas flow generating means includes a suctioning port arranged in the top plate and opening into the space between the hot plate and the top plate at a center of the top plate. In this case, the gas flows below the top plate from a peripheral portion of the substrate toward a central portion of the substrate. Typically, the gas flows into the space between a peripheral portion of the space between the hot plate and the top plate.

In an alternative embodiment, the gas flow generating means includes a gas discharge port and a gas suctioning port arranged on opposite sides of the hot plate, respectively, the gas discharge port being adapted to discharge a gas into the space between the hot plate and the top plate such that a gas flow having a width covering a width of the wafer is generated in the space between the hot plate and the top plate, and the gas suctioning port being adapted to suck the gas, whereby the gas flow flows in the space unidirectionally from one side of the wafer toward the other side of the wafer.

In one preferable embodiment, a heat-insulating member is arranged below the hot plate so as to cover the hot plate, the heat-insulating member having an evacuated internal chamber serving as a vacuum insulating layer. The heat-insulating member may be a low-profile, cylindrical member having a bottom, whereby a space is bounded below the hot plate by the hot plate and the cylindrical member. The apparatus may further include a gas inlet port adapted to supply a cooling gas for cooling the hot plate into the space below the hot plate, and an air outlet port adapted to discharge the cooling gas from the space below the hot plate. The apparatus may further include a substrate lifting member extending vertically through the heat-insulating member and the hot plate and adapted to vertically move the substrate in the space between the hot plate and the top plate; and a drive unit adapted to vertically move the substrate lifting member, and arranged below the hot plate and the heat-insulating member such that, as viewed in a vertical direction, the drive unit is located within an area defined by a periphery of the hot plate.

The present invention also provides a coating and developing system including: a carrier block adapted to receive or deliver a carrier holding substrates; a processing block including a coating apparatus adapted to coat a resist onto a substrate removed from a carrier, the aforementioned heating apparatus adapted to heat the substrate coated with the resist, a cooling apparatus adapted to cool the substrate having been heated, and a developing apparatus adapted to develop the substrate having been exposed; and an interface block adapted to transfer the substrate between the processing block and an exposing apparatus.

The present invention also provides a substrate heating method including: heating a top plate by a hot plate, which is arranged above a hot plate so that a vertical space is formed between the hot plate and the top plate, the top plate having an evacuated internal chamber serving as a vacuum insulating layer; placing a substrate, coated with a coating solution, on the hot plate; and heating the substrate to heat the coating solution, while generating a gas flow flowing through the space between the hot plate and the top plate.

In one preferred embodiment, the generating of the gas flow is performed by sucking a gas from the space between the hot plate and the top plate through a suctioning port arranged in the top plate and opening into the space between the hot plate and the top plate at a center of the top plate, whereby the gas flows below the top plate from a peripheral portion of the substrate toward a central portion of the substrate.

In one alternative embodiment, the generating of the gas flow is performed by jetting a gas from a first side of the hot plate while sucking the gas thus jetted from a second side of the hot plate opposite to the first side to generate an unidirectional gas flow, having a width covering a width of the wafer, flowing through the space between the hot plate and the top plate from the first side toward the second side.

A heat-insulating member may be arranged below the hot plate so as to cover the hot plate, the heat-insulating member having an evacuated internal chamber serving as a vacuum insulating layer. The placing of the wafer may be performed by raising or lowering a substrate lifting member extending vertically through the heat-insulating member, by means of a drive unit arranged below the hot plate and the heat-insulating member such that, as viewed in a vertical direction, the drive unit is located within an area defined by a periphery of the hot plate. The heat-insulating member may be a low-profile, cylindrical member having a bottom, whereby a space is bounded below the hot plate by the hot plate and the cylindrical member.

The method may further includes: supplying a cooling gas into the space below the hot plate to cool the hot plate, after the substrate having been heated is removed from the hot plate and before another substrate is placed on the hot plate.

BRIEF DESCRIPTION OF THE DRAWINGS

FIG. 7 is a perspecitve view of a hot plate support member of the heating apparatus of FIG. 1, which also shows the cross-section of the hot plate support member;

FIG. 8 is a bottom plan view of the hot plate schematically showing the arrangement of heaters;

DETAILED DESCRIPTION OF THE PREFERRED EMBODIMENTS

A heating apparatus according to the present invention will be described with an illustrative embodiment in which the apparatus performs a baking treatment that heats a semiconductor wafer (i.e., substrate) coated with a resist solution (i.e., coating solution) to form a resist film on the wafer.

Figure 1:
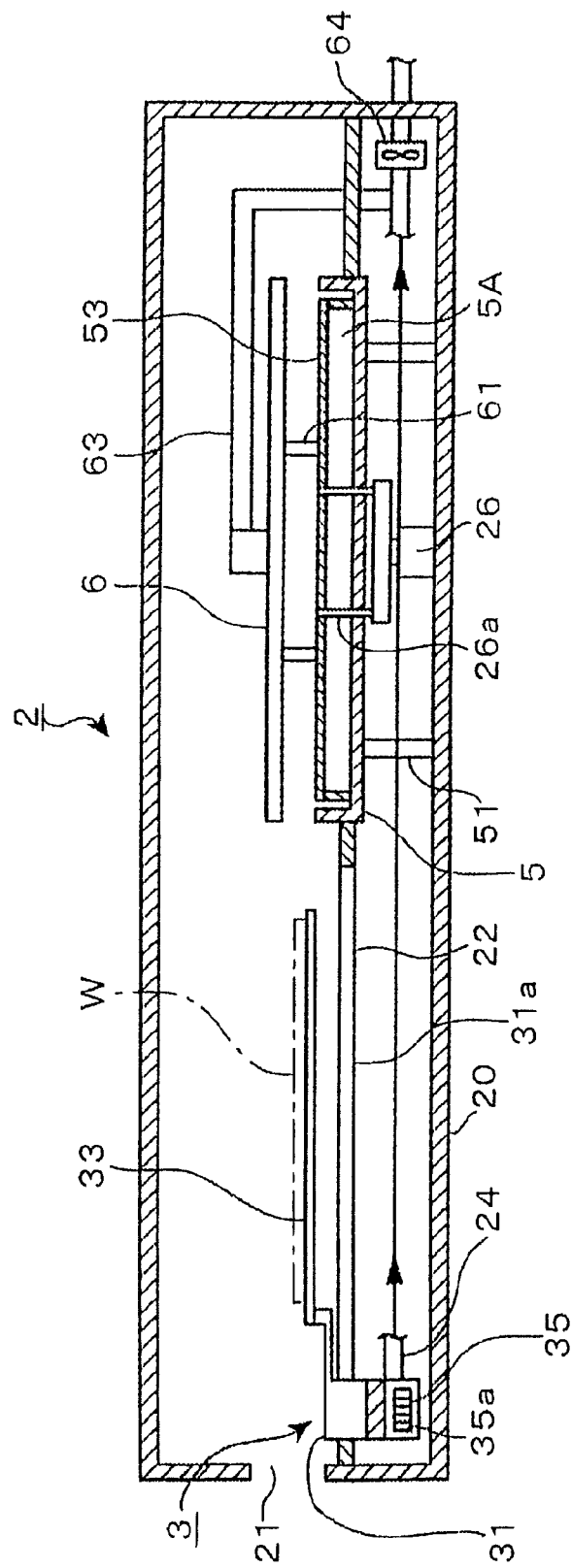
FIG. 1 is a vertical cross-sectional view of a heating apparatus in a first embodiment of the present invention.
Figure 2:
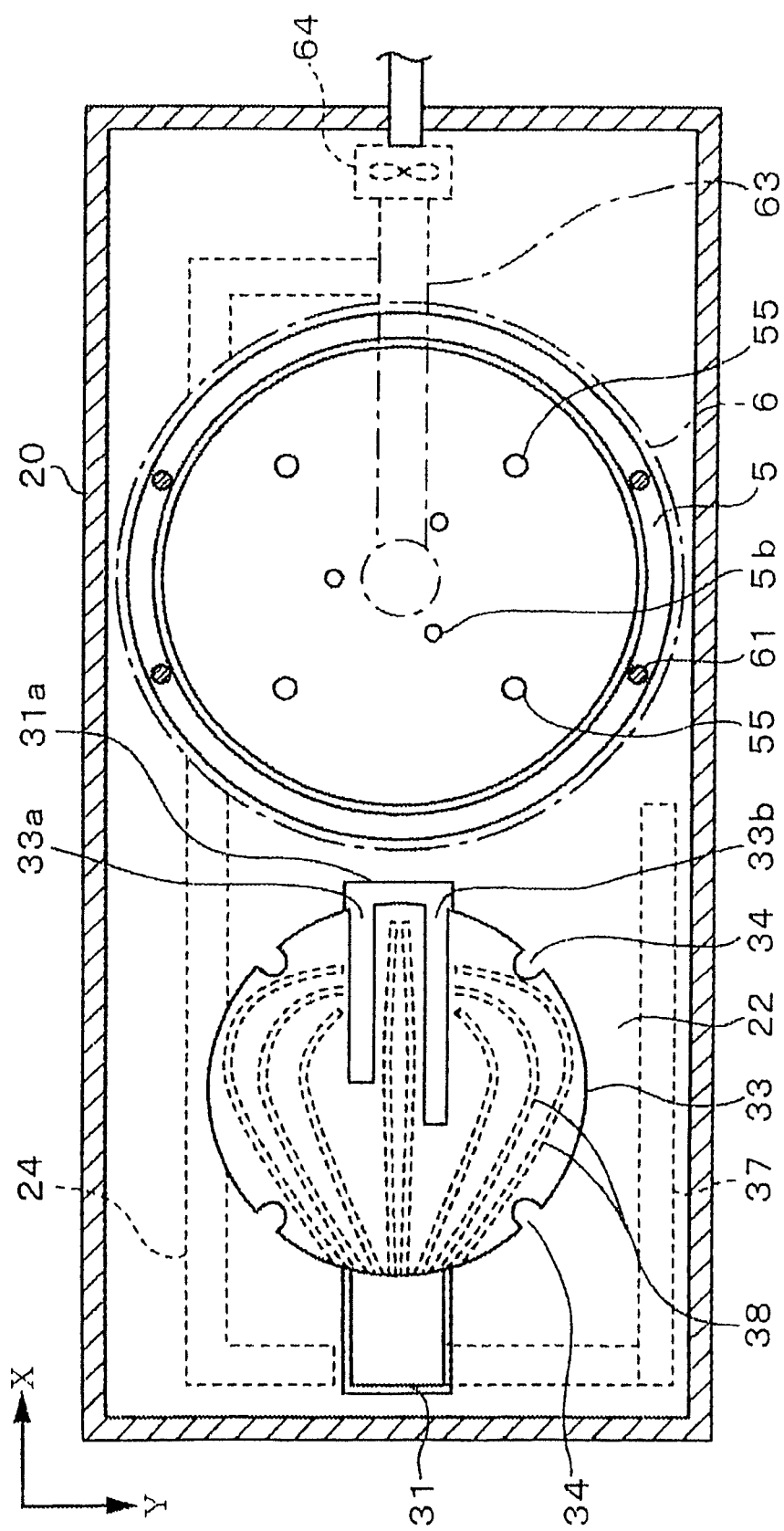
FIG. 2 is a horizontal cross-sectional view of the heating apparatus of FIG. 1.

Referring to FIGS. 1 and 2, the heating apparatus 2 includes a casing 20 having a side wall provided with a wafer-delivery opening 21. A base 22 is arranged in the casing 20 to define a space therebelow.

Figure 3:
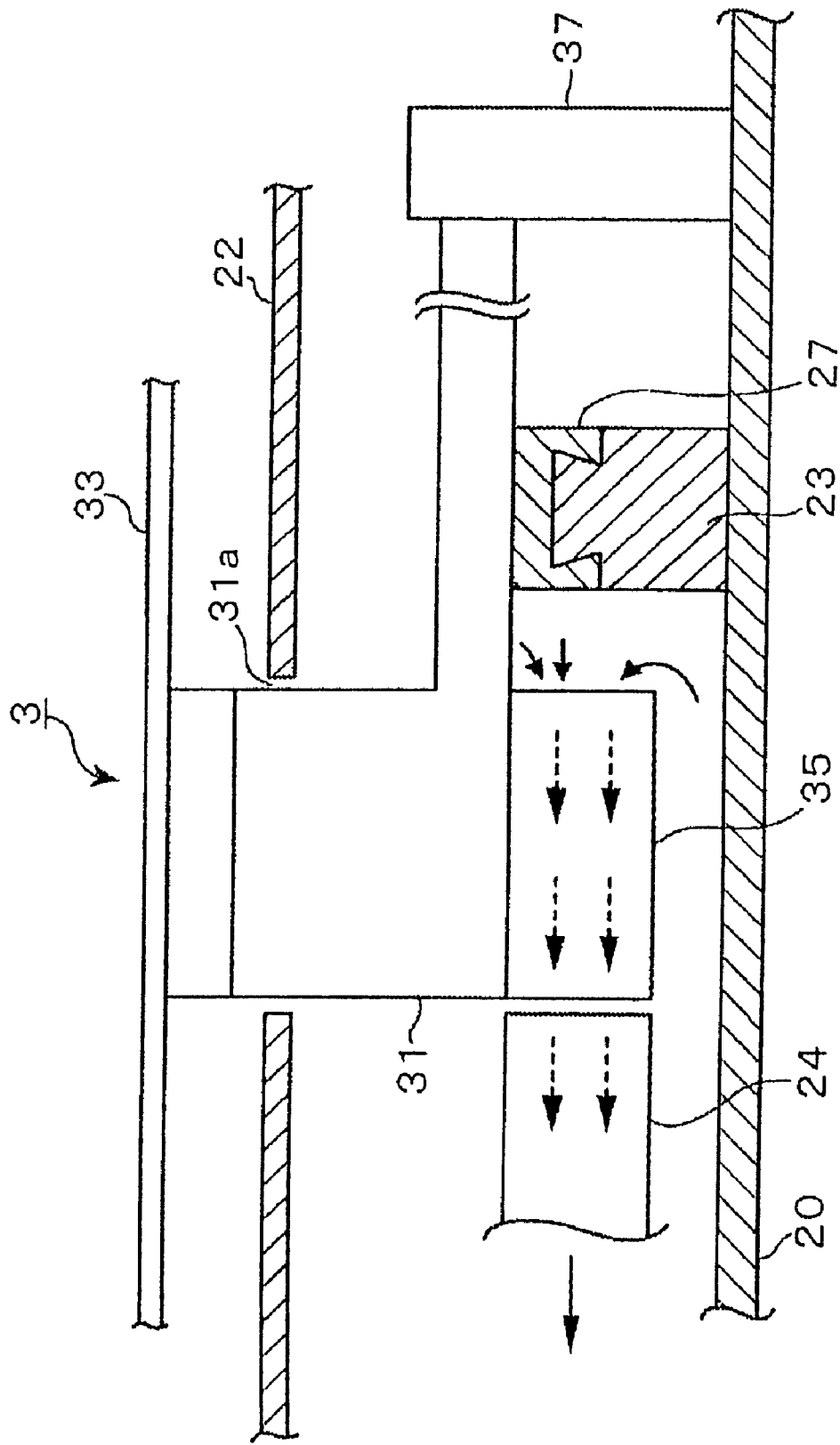
FIG. 3 is a vertical cross-sectional view of a cooling mechanism of the heating apparatus of FIG. 1.

Referring also to FIG. 3, a cooling mechanism 3 for cooling a wafer W is composed of a connecting bracket 31, a cooling plate 33 and heat-radiating fins 35. The task of the cooling mechanism 3 is not only cooling a wafer W but also transferring the wafer W between a hot plate 53 and a not shown wafer conveyer. The connecting bracket 31 is made of a heat-conductive material such as copper or aluminum. The connecting bracket 31 passes through a slit or an opening 31a formed in the base 22. A rail catch 27 is connected to a bottom of the connecting bracket 31. The connecting bracket 31 is engaged with a guide rail 23, extending in X-direction in FIG. 2, through the rail catch 27. The proximal end of the connecting bracket 31 is connected to a driving mechanism 37, which is arranged below the base 22, and which may be a ball-screw mechanism or an air cylinder actuator. The cooling mechanism 3 is capable of moving in X-directions along the guide rail 23 by means of the driving mechanism 37.

The cooling plate 33 having a circular shape is connected to an upper portion of the connecting bracket 31 to support a wafer W thereon. In a typical embodiment, the cooling plate 33 is made of aluminum and has a thickness of 4 mm. The diameter of the cooling plate 33 is essentially the same as that of a wafer W to be placed on the cooling plate 33. Four cut-outs 34 are formed in the periphery of the cooling plate 33. Slits 33a and 33b are also formed in the cooling plate 33 through which support pins 26a (described later) pass. Heat pipes 38 are embedded in the cooling plate 33, and are arranged in a manner similar to a leaf vein. The proximal end of each of the heat pipes 38 is connected to the connecting bracket 31.

Figure 4A:
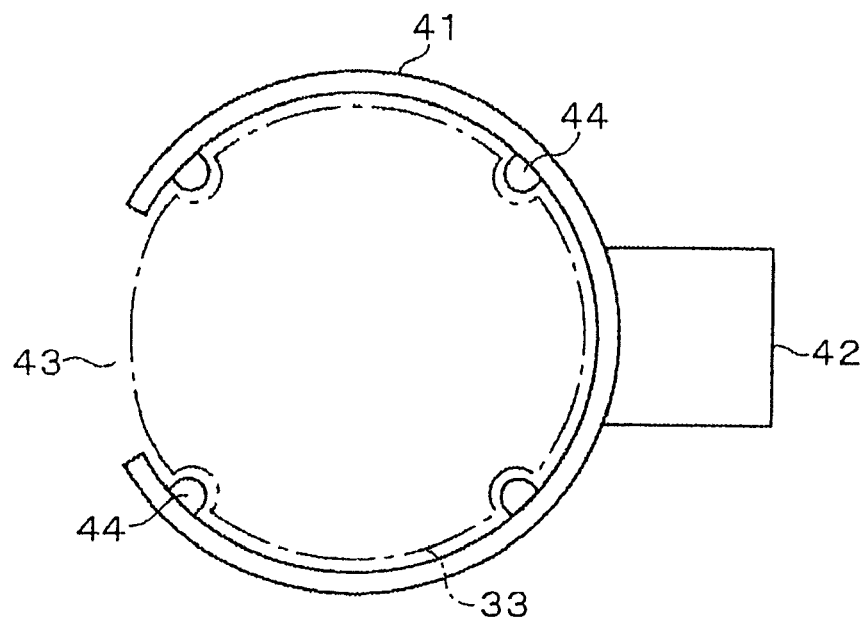
FIG. 4A is a top plan view of a wafer transfer arm of a wafer conveyer and a cooling plate of the cooling mechanism of FIG. 3, for explanation of the transfer of the wafer between the wafer conveyer and the cooling mechanism.
Figure 4B:
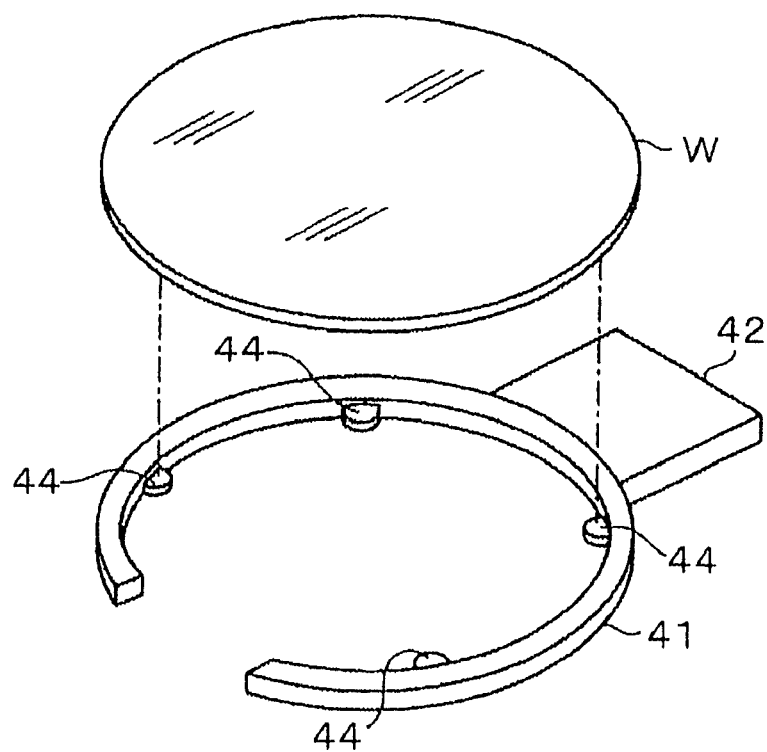
FIG. 4B is a perspective view of the wafer transfer arm and a wafer.

An illustrative example of a wafer conveyer for transferring a wafer to and from the cooling plate 33 is shown in FIGS. 4A and 4B, and includes a carrying arm 41 having a horseshoe shape and a carrying base 42 that supports the carrying arm 41. The carrying arm 41 has an inner circumference of a diameter slightly larger than that of the cooling plate 33. Four projections 44 project inward from the inner circumference of the carrying arm 41 to support a wafer W thereon as shown in FIG. 4B. The carrying arm 41 is capable of horizontal and vertical movement by means of a not shown driving mechanism. The carrying arm 41 holding a wafer moves into the casing 20 through the wafer-delivery opening 21, when the wafer W is transferred from the wafer conveyer to the cooling plate 33. The cut-outs 34 of the cooling plate 33 are arranged at angular positions corresponding to those of the projections 44 of the carrying arm 41. Thus, when the carrying arm 41 lowers from a position above the cooling plate 33 to a position below the same while the carrying arm 41 and the cooling plate 33 are aligned vertically as shown in FIG. 4A, the wafer W supported on the carrying arm 41 is transferred to the cooling plate 33. The carrying arm 41 from which the wafer is removed is withdrawn from the casing 20 without colliding with the connecting bracket 31 due to the provision of a cut-away portion 43 of the carrying arm 41.

Figure 17:
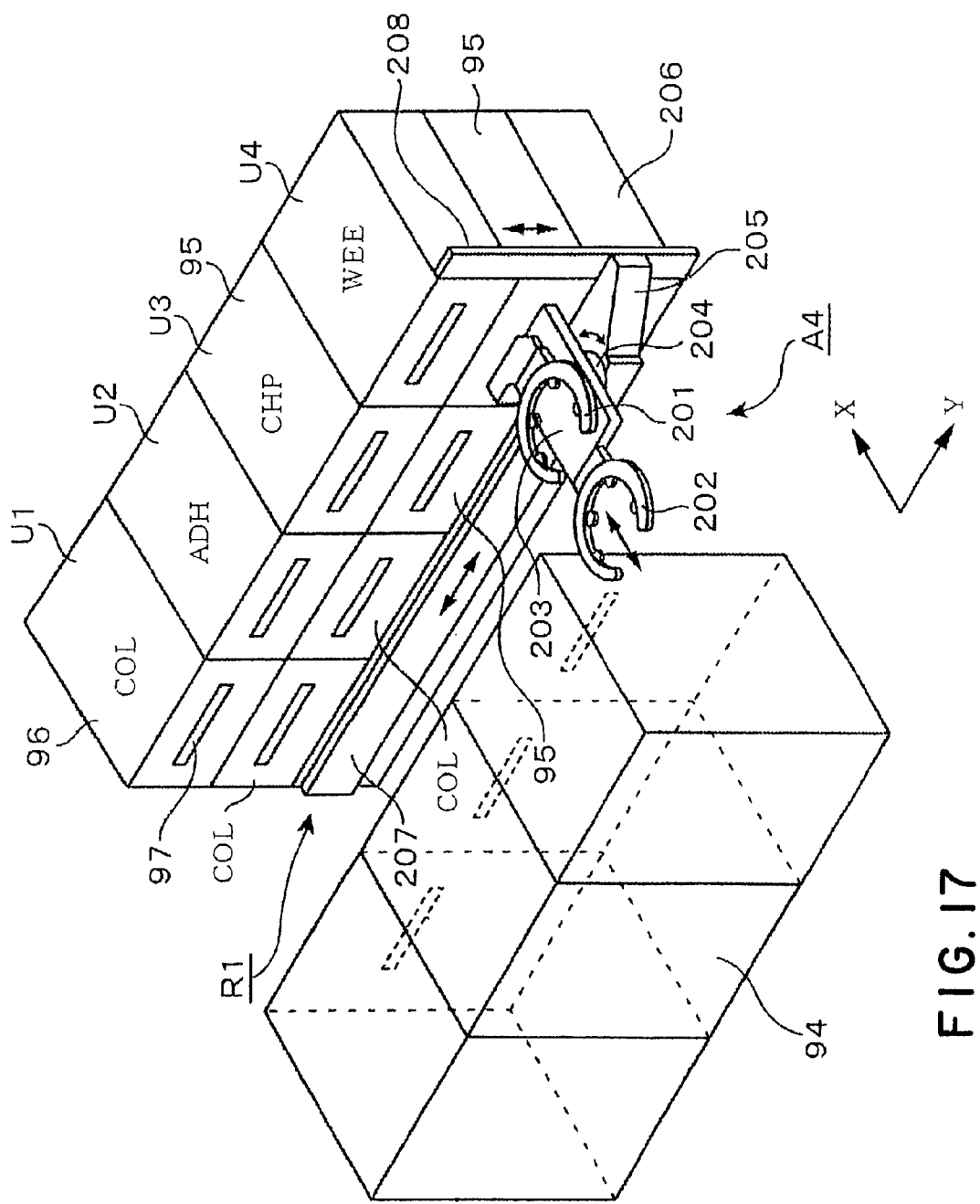
FIG. 17 is a perspective view of coating units and unit-stacks, and a wafer conveyer installed in the coating and developing system of FIG. 14.
Figure 18:
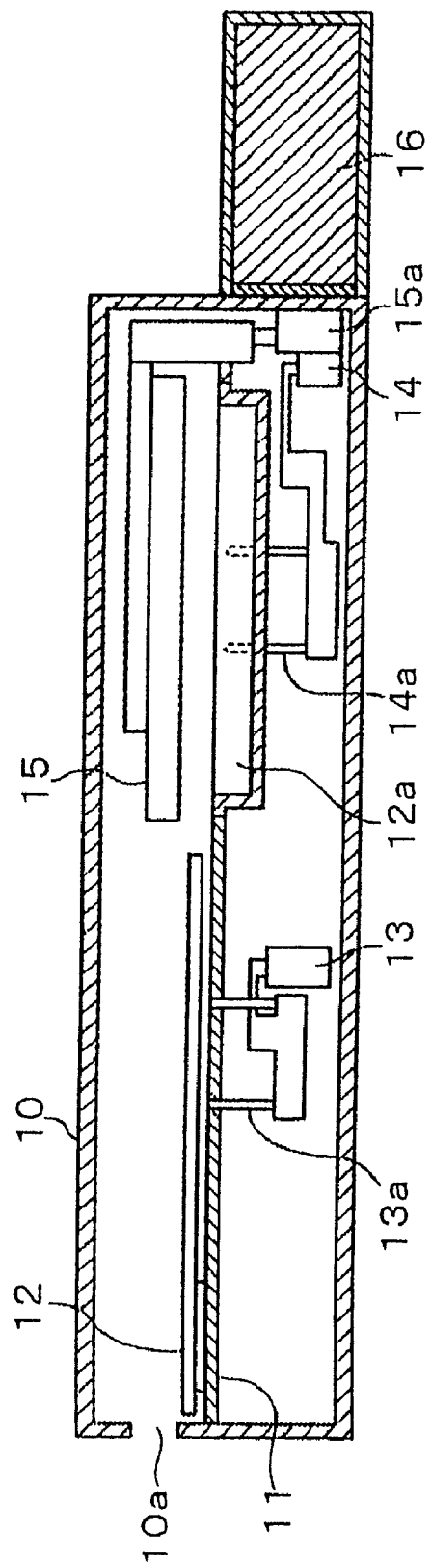
FIG. 18 is a vertical cross-sectional view of a conventional heating apparatus.
Figure 19:
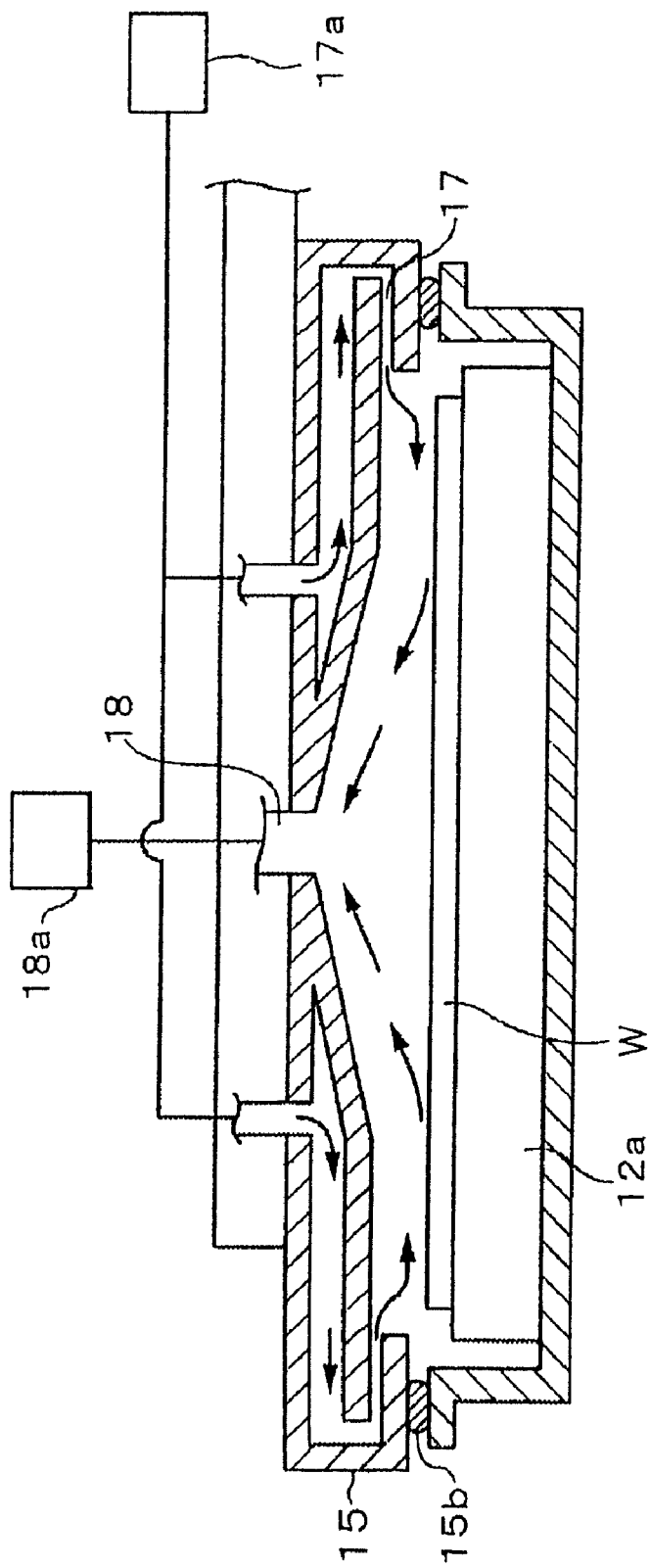
FIG. 19 is a vertical cross-sectional view of a top plate of the conventional heating apparatus of FIG. 18.

Note that the not shown wafer conveyer and the carrying arm 41 respectively correspond to main arms A1 to A5 carrying arms 201 and 202, which will be described later with reference to FIG. 17.

Referring back to FIGS. 1 to 3, a fin structure 35 for air-cooling is connected to the connecting bracket 31. The fin structure 35 comprises a plurality of fins 35a (see FIG. 1), which may be made of aluminum. A local suctioning duct 24 is arranged in the space below the base 22. The local suctioning duct 24 has a suctioning port, which opens into the space below the base 22 at a position adjacent to the fin structure 35 when the cooling plate 33 is located at its home position (i.e., the position where the cooling plate 33 receives a wafer W from the wafer conveyer). The distance between the suctioning port and the fin structure 35 is determined such that air flow (gas flow), generated by suctioning air from the suctioning port of the suctioning duct 24 and passing through gaps between the fins 35a, has a flow rate high enough to achieve a sufficient cooling effect of the fin structure 35. The local suctioning duct 24 is connected to a suctioning duct 63, which will be described later. When air is sucked from the suctioning port of the suctioning duct 24, the fins 35a are cooled, the proximal ends of the heat pipes 38 are cooled via the connecting bracket 31, the surfaces of the heat pipes 38 are cooled, and thus the wafer W placed on the cooling plate 33 is cooled. Note that the casing 20 of the heating apparatus 2 may be filled with a gas other than clean air, such as an inert gas, and in this case, an inert gas flow is generated by the suctioning operation.

The shape of the heat pipe 38 is not limited to a "pipe (circular tube)" shape, and may be a flattened hollow shape having a wide inner cavity containing a working fluid therein. Alternatively, the cooling plate 33 may be provided with an internal space containing a working fluid therein while the heat pipes 38 are omitted. In this case, preferably, the thickness (i.e., vertical dimension) of the cooling plate 33 and its internal space at the proximal side of the cooling plate 33 is larger than that at the distal side of the cooling plate 33, thereby enhanced heat transfer between the connecting bracket 31 and the working fluid can be achieved.

The cooling mechanism 3 is not limited to the air-cooling type, and may be a liquid-cooling type. For example, the cooling plate 33 may be provided with a cooling liquid passage, which may be formed in the cooling plate 33, or may be arranged on the back surface of the cooling plate 33.

Figure 5A:
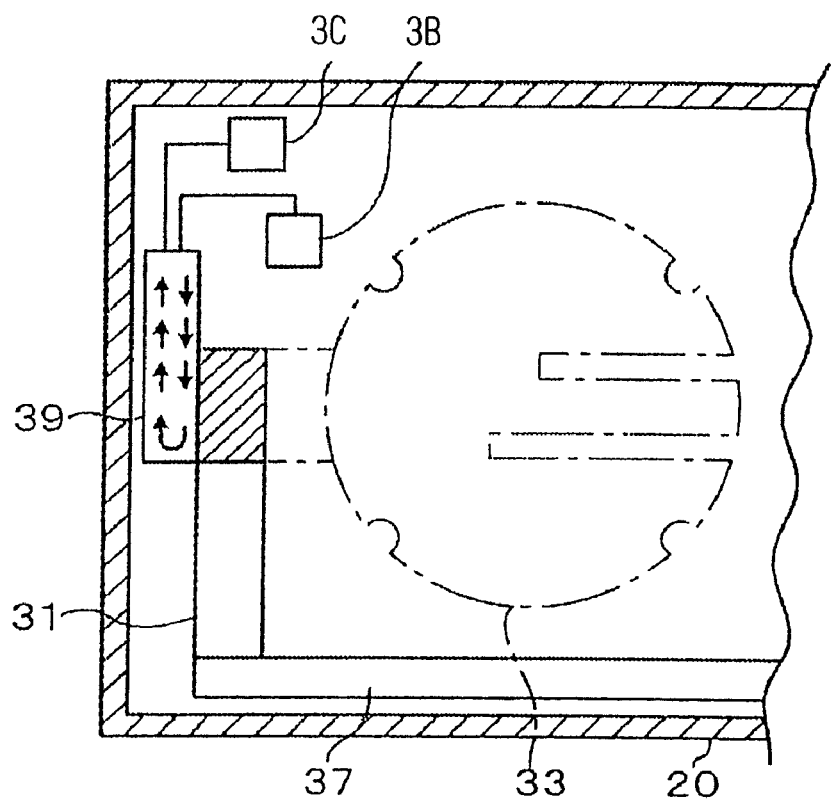
FIGS. 5A and 5B are horizontal and vertical cross-sectional views of a cooling mechanism in an alternative embodiment.
Figure 5B:
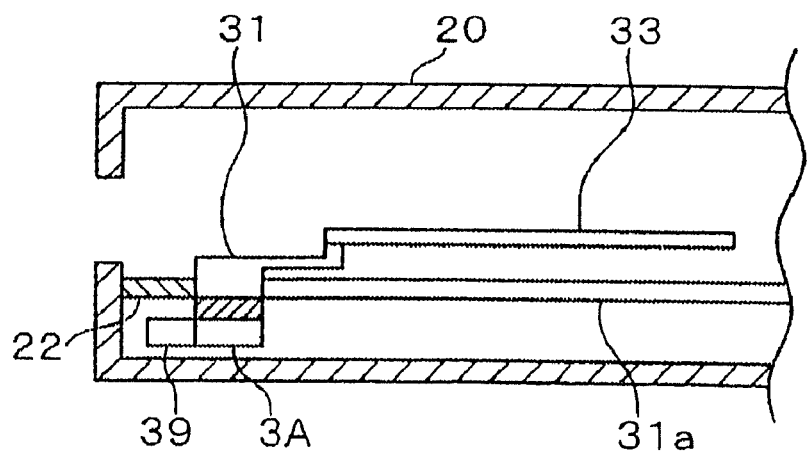

Alternatively, the cooling mechanism 3 may be configured as shown in FIGS. 5A and 5B, and which may include: a water block 39 connected to a water supply mechanism 3B and a water discharge mechanism 3C and internally provided with a wafer passage through which water flows (see arrows in FIG. 5A); and a heat transfer block 3A connected to the connecting bracket 31. In the embodiment of FIGS. 5A and 5B, the local suctioning duct 24 and the fin structure 25 in FIGS. 1 to 3 are replaced with the water block 39 and the heat transfer block 3A, respectively. When the cooling plate 31 is located at the home position, heat transfer block 3A contacts the water block 39, thereby the heat transfer block 3A is cooled by the water block 39, and the heat pipe 38 and thus the cooling plate 33 are cooled.

Figure 6:
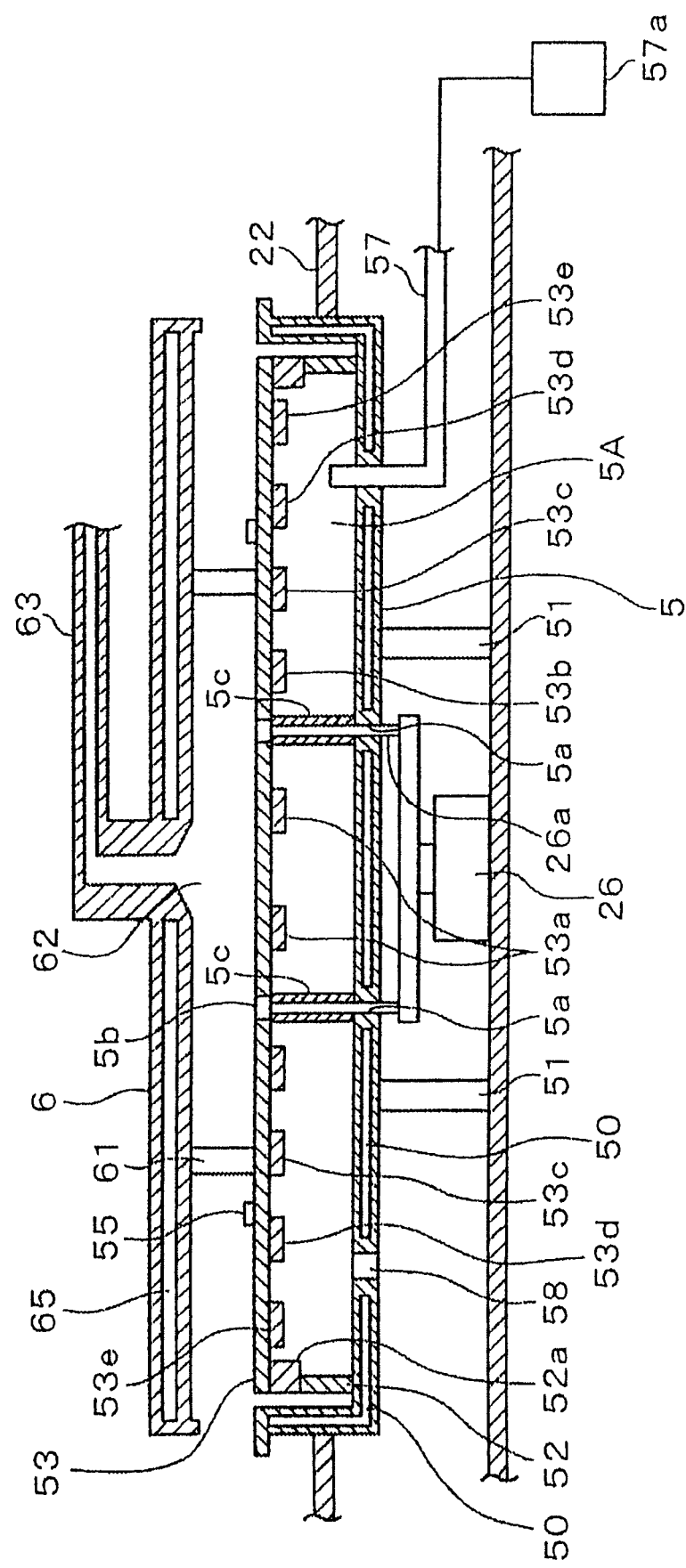
FIG. 6 is a vertical cross-sectional view showing the detailed structure of a hot plate, a top plate and relevant component parts of the heating apparatus of FIG. 1.

At the back of the casing 20, a hot-plate support member 5 having a shape of a flat cylinder is embedded in the base 22. As shown in FIGS. 6 and 7, vacuum chambers 50 serving as vacuum insulating layers are formed in a circumferential wall and a base wall of the support member 5, to provide the same with a heat-insulating ability. In detail, a circular, central vacuum chamber 50 is arranged at the center of the base wall, and ring-shaped vacuum chambers 50 are arranged radially outside the central vacuum chamber 50. The vacuum chambers 50 are radially spaced from each other, so that a gas supply pipe 57, a gas discharge hole 58, and holes 5a can pass through areas of the base wall where the vacuum chambers 50 are not arranged.

Three columns 51, arranged circumferentially, extend upward from the bottom of the casing 20 to support the hot-plate support member 5. A support ring 52 is arranged on the base wall of the support member 5 to position inwardly adjacent to the circumferential wall of the support member 5. A disk-shaped (circular) hot plate 53 is supported on the support ring 52 via a heat-insulating ring 52a which may be made of a heat-resistant resin material or a ceramic material. The hot plate 53 has a size (diameter) greater than that of a semiconductor wafer W (i.e., a process object), and smaller than that of the hot-plate support member 5 surrounding the hot plate 53.

As shown in FIG. 8, ring-shaped heaters 53a to 53e of different diameters are concentrically arranged on a lower surface of the hot plate 53. Each of the outer two heaters 53f and 53e is divided into four segments. A plurality of temperature sensors (not shown) are arranged at different positions on the lower surface of the hot plate 53. The heaters 53a to 53e are connected to a power supply 54, and are independently controlled by a controller of the heating apparatus 2. The controller controls the calorific power of each of the heaters 53a to 53e through the power supply 54 based on the sensor signals received from the not shown temperature sensors, so that any desired temperature distribution of the hot plate 53 is achieved. Thus, the hot plate 54 is capable of providing the peripheral portion of the wafer W, which portion is likely to be cooled due to heat dissipation, with a calorific power greater than that provided to the central portion of the wafer W. Note that the configuration and the arrangement of the heaters are not limited to those shown in the drawings.

As shown in FIG. 6, four projections 55 are circumferentially arranged on the hot plate 53 to support the back surface of the wafer W. The height of the projections 55 is preferably in the range of 0.3 to 1.0 mm, and is 0.3 mm in the illustrated embodiment. If the height is less than 0.3 mm, it is possible that a warped wafer of a large diameter (e.g., 12 inches or larger) directly contact the hot plate 53. If the height is greater than 1.0 mm, heat of the hot plate 53 is not transferred to the wafer W efficiently, deteriorating in-plane uniformity of the baking treatment.

Three holes 5a are formed in the central portion of the hot-plate support member 5, and three holes 5b are formed in the central portion of the hot-plate 53. Three support pins 26a respectively pass through the three holes 5a, and are connected to a drive unit 26 arranged right below the hot-plate support member 5. The drive unit 26 is arranged right below the hot plate 53, in other words, the vertical projection of the drive unit 26 is entirely located within the vertical projection of the hot plate 53. The drive unit 26 vertically moves the support pins 26a through the holes 5b, whereby the support pins 26a project from the upper surface of the hot plate 53 and retract into the hot plate 53. When the support pins 26a holding a wafer W descend, the wafer W is transferred from the support pins 26a to the projections 55. In FIG. 6, reference numeral 5c denotes cylindrical guide members which guide the support pins 26a for vertical movement.

As shown in FIG. 6, a closed space 5A (hereinafter referred to as "gas-flowing space") is bounded by the support member 52, heat-insulating ring 52a, hot plate 53 and the hot-plate support member 5. The distal end of each of a plurality of gas supply pipes 57 (only one of them is shown in FIG. 6) penetrates the hot-plate support member 5 to open into the gas-flowing space 5A. The proximal end of each gas supply pipe 57 is connected to a gas supply source 57a, which stores a clean purging gas, such as an inert gas (e.g., nitrogen gas), to be used for cooling the hot plate 53. A plurality of gas discharge holes 58 (only one of them is shown in FIG. 6) are formed in the hot-plate support member 5 to open into the gas-flowing space 5A. When the purging gas is supplied into the gas-flowing space 5A from the gas supply source 57a through the gas supply pipes 57, the purging gas draws heat from the hot plate 53 and is ejected through the gas discharge holes 58 from the gas-flowing space 5A, thereby the temperature of the hot plate 53 can be lowered.

The hot-plate support member 5 is not limited to a one-piece structure as shown in the drawings, and may be divided into plural segments. For example, the hot-plate support member 5 may be composed of a central segment and a peripheral segment fitted to the central segment. In thus case, gas supply pipe (57) insertion holes, the gas discharge holes 58, and holes 5 may be formed in the central segment. In addition, the configuration of the hot-plate support member 5 is not limited to what previously mentioned (namely, a shape of a cylinder with a bottom, or a shape of a cup), and may be a plate shape without a circumferential (side) wall.

As shown in FIGS. 1, 2 and 6, four posts 61, which are spaced apart from each other, are arranged on the upper end portion (i.e., the upper end of the circumferential wall) of the hot-plate support member 5. The upper ends of the posts 61 are connected to a peripheral portion of a circular top plate 6. The top plate 6 is sized such that it covers at least the effective area of a wafer W (i.e., an area in which semiconductor devices are formed) entirely. In the illustrated embodiment, the top plate 6 is sized such that it covers the hot plate 53 entirely. In other words, as viewed in the vertical direction, the hot plate 53 or the effective area of the wafer W is located within an area defined by the contour of the top plate 6. The top plate 6 opposes the hot plate 53. The vertical spacing between the hot plate 53 and the top plate 6 is preferably in the range of 12 to 15 mm, and is 14 mm in the illustrated embodiment. If the spacing is smaller than 12 mm, it is possible that the cooling plate 33 collides with the top plate 6 or the hot plate 53 when the cooling plate 33 move into the space between the top plate 6 and the hot plate 53. If the spacing is larger than 15 mm, if is possible that the top plate 6 is not sufficiently heated when heating the wafer W.

As shown in FIG. 6, a suctioning port 62 is opened into a space below the top plate 6 at the central portion of the lower surface of the top plate 6. The suctioning port 62 is inversely tapered toward the lower and thereof. The suctioning port 62 is connected to a suctioning duct 63 connected to an upper portion of the top plate 3. As shown in FIG. 1, the local suctioning duct 24 is connected to the suctioning duct 63 at a joint located downstream of the suctioning port 62. The suctioning duct 63 is provided with a fan 64, namely a forced exhaust means, at a position downstream of the joint. The downstream end of the suctioning duct 63 is connected to a factory exhaust system. The atmosphere in the space around the top plate 6 is sucked into the suctioning port 62 by operating the fan 64, thereby an air flow, indicated by arrows shown in FIG. 9, flowing from the peripheral portion toward the central portion of the wafer W placed on the hot plate 53. The flow rate of the air can be appropriately controlled by controlling the rotation speed of the fan 64.

The top plate 6 is internally provided with a vacuum chamber 63 serving as a vacuum insulating layer of the top plate 6. The vacuum chamber 63 extends outwardly from the suctioning port 62. Due to the provision of the vacuum chamber 63, heat transfer from the lower surface to the upper surface of the top plate 6 is restricted. Thus, when the wafer W is heated by the hot plate 53, the lower surface of the top plate 53 is heated effectively by the thermal radiation emitted from the hot plate 53, thereby the temperature of the lower surface of the top plate can be maintained at a temperature close to the temperature of the wafer W, and the change in the temperature of the lower surface of the top plate 6 traces the change in the temperature of the wafer W. In the illustrated embodiment, the heating apparatus 2 is designed so that the lower surface of the top plate 6 can be maintained at a temperature (in Celsius scale) 70% or more of the temperature of the wafer W. In a case where the spacing between the hot plate 53 and the top plate 3 is 14 mm, if the temperature of the lower surface of the top plate 6 is lower than 70% of the temperature of the wafer W, it is possible that the air flow flowing through the space between the hot plate 53 and the top plate 3 may be disadvantageously disturbed for the same reason as previously mentioned in the "Background of the Invention"

The controller of the heating apparatus 2 will be described. The controller comprises a computer having a data storage medium which stores a control program for carrying out a process recipe defining a sequence of operations of the heating apparatus 2, which includes transferring of the wafer W, heating of the wafer W, controlling of the air flow. Upon execution of the control program by the computer, the computer controls the heating apparatus 2 according to the process recipe, so that the heating apparatus 2 carries out the operations (process steps) mentioned below. The data storage medium for storing the control program may be a HDD (hard disk drive), which is typically fixedly installed in the computer. Alternatively, the data storage medium may be a removable media, such as a CD (compact disk), an MO (magnetooptic disk) and a memory card. In this case, the computer is provided with a reader adapted to read such a removable media.

The operations of the baking apparatus will be described. The not shown wafer conveyer having the carrying arm 42 (see FIG. 4) carries a wafer W coated with a resist solution into the casing 20 through the delivery opening 21. The wafer conveyer transfers the wafer W to the cooling plate 33 in the manner previously described with reference to FIGS. 4A and 4B. The wafer conveyer moves out of the casing 20. Before the cooling plate 3 moves to the hot plate 53, the heaters 53a to 53e heat the hot plate 53, so that the upper surface of the hot plate 53 is heated up to a designated temperature such as 130° C., and the lower surface of the top plate 6 is heated by thermal radiation emitted from the hot plate 53.

The cooling plate 33 holding the wafer W moves to a position right above the hot plate 53, and then the support pins 26a rise to support the back surface of the wafer W held by the cooling plate 33. The cooling plate 33 moves back to its home position (the left end position in FIG. 1), and then the support pins 26a lower to place the wafer W on the projections 55. Thus, the wafer W is heated by the hot plate 53. Preferably, the heaters arranged in the peripheral portion of the hot plate 53 generate more calorific power than that generated by the heaters arranged in the central portion of the hot plate 53, in order to achieve in-plane uniformity of the baking treatment.

Figure 9:
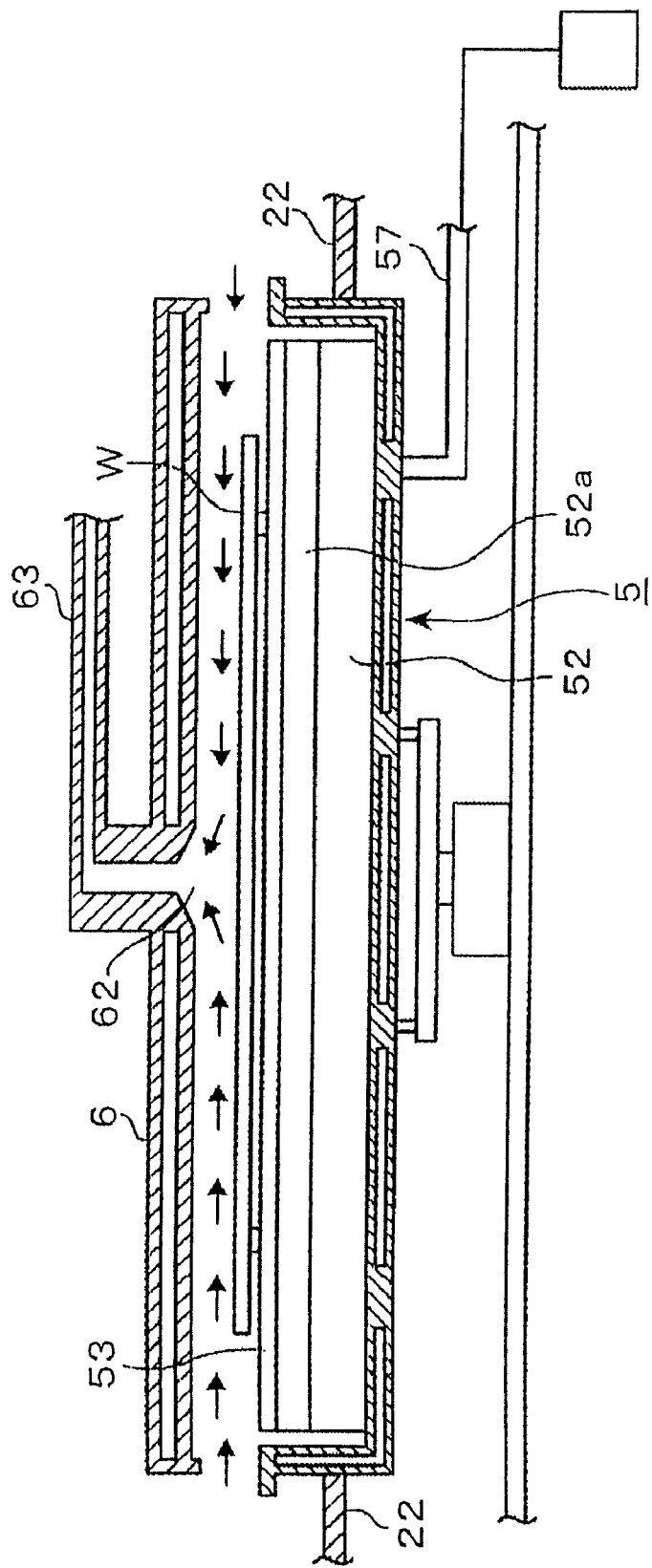
FIG. 9 is an illustration showing an air (gas) flow flowing through a space between the hot plate and the top plate of the heating apparatus of FIG. 1.
Figure 10:
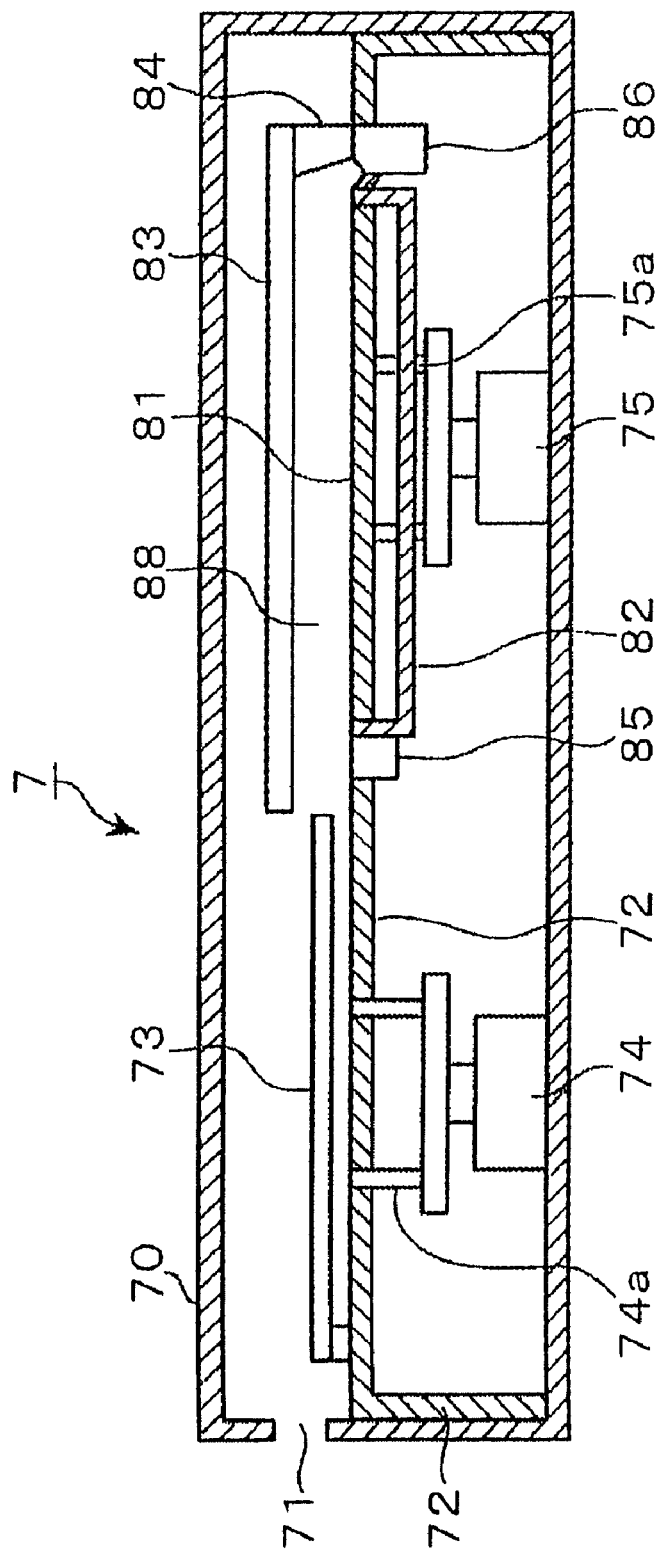
FIG. 10 is a vertical cross-sectional view of a heating apparatus in a second embodiment of the present invention.

When the wafer W is being heated, the fan 64 is operated to suck air (gas) through the suctioning port 62, thereby air (i.e., air in the casing 20) flows into the space between the hot plate 53 and the top plate 6 from outside the space. As the top plate 6 opposes the hot plate 53, the air flow is guided by these plates 6 and 53 to flow radially inwardly and substantially parallel to the surface of the wafer W, as shown in FIG. 9. The solvent contained in the resist solution coated on the surface of the wafer W is vaporized and a part or parts of components of the resist are sublimed, by heating the wafer W. The vaporized solvent and the sublimed components are carried by the air flow, and sucked into the suction port 63. In the above manner, the resist solution is dried, and thus a resist film is formed on the wafer W. Note that the casing 20 of the heating apparatus 2 may be filled with a gas other than clean air, such as an inert gas, and in this case, an inert gas flow is generated by the suctioning operation.

After the wafer W has been heated for a predetermined time, the support pins 26a rise to support the wafer W thereon. The cooling plate 33 moves to the position right above the hot plate 53, and the wafer W is transferred to the cooling plate 33 from the support pins 26a. Heat is transferred from the hot wafer W to the cooling plate 33, so that the temperature of the cooling plate 33 rises. When the cooling plate 33 returns to its home position, the suctioning port of the local suctioning duct 24 and the fin structure 35 of the cooling mechanism 3 are aligned with each other. Thus, the air to be sucked by the local suction duct 24 passes through the fin structure 35 to cool the same. Accordingly, the connecting bracket 31 is cooled, and the cooling plate 33 is cooled via the heat pipe 33. The not shown wafer conveyer will pick up the wafer W from the cooling plate 33 to transfer the wafer W to another apparatus according to a predetermined transfer schedule, which will be described later. Before picking-up of the wafer by the wafer conveyer, the primary cooling of the wafer W is carried out by the cooling plate 33.

The transfer arm 41 of the wafer conveyer scoops up the wafer W from the cooling plate 33, and takes the wafer W out of the casing 20. Thereafter, the next wafer W will be carried into the heating apparatus 2, and will be subjected to the baking treatment in the aforementioned manner.

If wafers W of a first process lot and wafers W of a second process lot are sequentially processed by the heating apparatus 2 and if the process temperature (baking temperature) for the second lot is lower than and that for the first lot, the temperature of the hot plate 53 must be rapidly lowered to a temperature suitable for the process temperature for the second lot after all the wafers W of the first lot has been processed, in order to improve the throughput of the apparatus. In this case, the purging gas is supplied into the gas-flowing space 5A (see FIG. 6) from the gas supply source 57a through the gas supply pipes 57, thereby the hot plate 53 can be cooled rapidly.

The aforementioned heating apparatus 2 achieves the following advantages.

As the top plate 6 is internally provided with a vacuum chamber 65, little amount of heat is dissipated from the upper surface of the top plate 6. Thus, even if the hot plate 53 and the top plate 6 are vertically spaced from each other and thus a certain amount of heat is drawn from the space between these plates 6 and 53 through the peripheral portion of the space, the lower surface of the top plate 6 can be maintained at a temperature close to the temperature of the wafer W. Accordingly, it is possible to omit an elevating mechanism provided at a conventional heating apparatus that vertically moves a top plate to define a closed space between a hot plate and the top plate in order to keep the temperature of the lower surface at a sufficiently high temperature. Furthermore, a heater embedded in the top plate for heating the same is not necessary. Therefore, with a simple structure of the heating apparatus, the temperature difference between the wafer W and the lower surface of the top plate 6 can be limited to a sufficiently small value, and thus the air flow flowing through the space between the hot plate 53 and the top plate 6 is not disturbed due to the temperature difference, resulting in improved in-plane uniformity of the baking treatment. In addition, as the air flows smoothly between through the space between the hot plate 53 and the top plate 6, adhesion of sublimed resist components to the top plate 6 is suppressed, saving the maintenance work. Furthermore, as the top plate 6 does not provided with a heater, the total heat capacity of the top plate 6 is relatively small, and thus the temperature of the top plate 6 can be lowered rapidly when needed (e.g., change in the production lot). As the top plate 6 does not provided with a heater, the top plate can be formed in a low profile (height), resulting in downsizing of the heating apparatus.

As the hot-plate support member 5 provided with the heat-insulating vacuum chamber (vacuum insulating layer) 50 is arranged below the hot plate 53, the drive unit 26 for elevating the support pins 26a can be arranged right below the hot plate 53 without damaging the drive unit 26 due to thermal radiation emitted from the hot plate 53. As the drive unit 26 is arranged right below the hot plate 53, the footprint of the baking apparatus can be reduced.

The hot plate 53 can be cooled rapidly by supplying a purging gas into the gas-flowing space 5A bounded by the hot plate 53 and the hot-plate support member 5 through the gas supply pipe 57. When the temperature of the hot plate 53 is lowered, the temperature of the top plate 6, whose temperature is dependent on an amount of radiant heat emitted from the hot plate 53, is also lowered to trace the change in the temperature of the hot plate 53. Also in this point of view, the temperature of the top plate can be lowered rapidly when needed (e.g., change in the production lot).

FIGS. 10 to 13 show another embodiment (7) of the heating apparatus, which mainly differs from the embodiment (2) of FIGS. 1 to 9 in the means for generating an air flow in the space between the hot plate and the top plate.

In FIGS. 10 to 13, reference numerals 70, 71 and 72 denote a casing, a wafer delivery port and a base, respectively. Reference numeral 73 denotes a cooling plate, which may be of the same structure as the cooling plate 33 in the previously described embodiment. However, in the embodiment of FIGS. 10 to 13, the cooling plate 73 is provided with a cooling medium passage (not shown) through which a cooling medium flows to cool a wafer W placed on the cooling plate 73. The cooling plate 73 in this embodiment also moves horizontally to convey the wafer in the casing 70. The heating apparatus 7 includes an elevating mechanism 74, which moves support pins 74a vertically in order to transfer the wafer W between the cooling plate 73 and a not shown wafer conveyer. The reference numeral 75a denotes support pins, which are moved vertically by means of an elevating mechanism 75 in order to transfer the wafer W between the cooling plate 73 and a hot plate 81. The support pins 75a and the elevating mechanism 75 have essentially the same structure as those of support pins 26a and the elevating mechanism 26 in the previously described embodiment.

A hot plate 81 has essentially the same structure as that of the hot plate 51 in the previously described embodiment, and the circumference and the bottom of the hot plate 81 is surrounded by a hot-plate support member 82, which has essentially the same structure as that of the hot-plate support member 5 in the previously described embodiment. Reference numeral 81a denotes projections arranged on the hot plate 81 for supporting the wafer W thereon; and reference numeral 82a denotes vacuum cambers formed in the circumferential wall and the bottom wall of the hot-plate support member 82 and serving as a vacuum insulating layer.

A top plate 83 for rectifying air flow is fixed above the hot plate 81 via a support 84 to oppose the hot plate 81. The top plate 83 is internally provided with a vacuum chamber 83a serving as a vacuum insulating layer, whose area in a plan view is greater than that of the hot plate 81. The support 84 is internally provided with a vacuum chamber 84a to suppress heat transfer from the hot plate 81 to the top plate 83. Thus, the top plate 83 and the support 84 have vacuum insulating structures.

Figure 11:
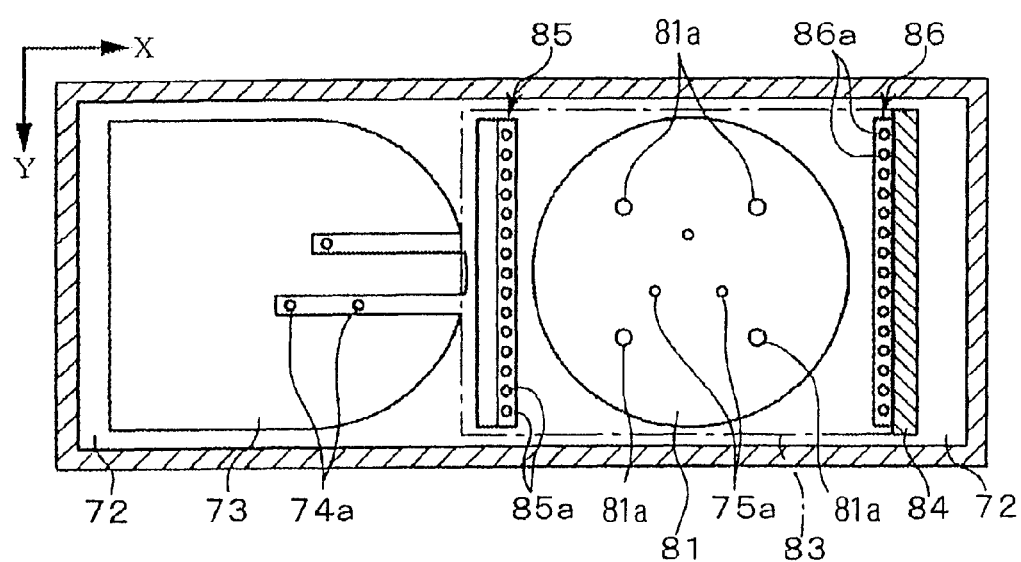
FIG. 11 is a horizontal cross-sectional view of the heating apparatus of FIG. 10.
Figure 12:
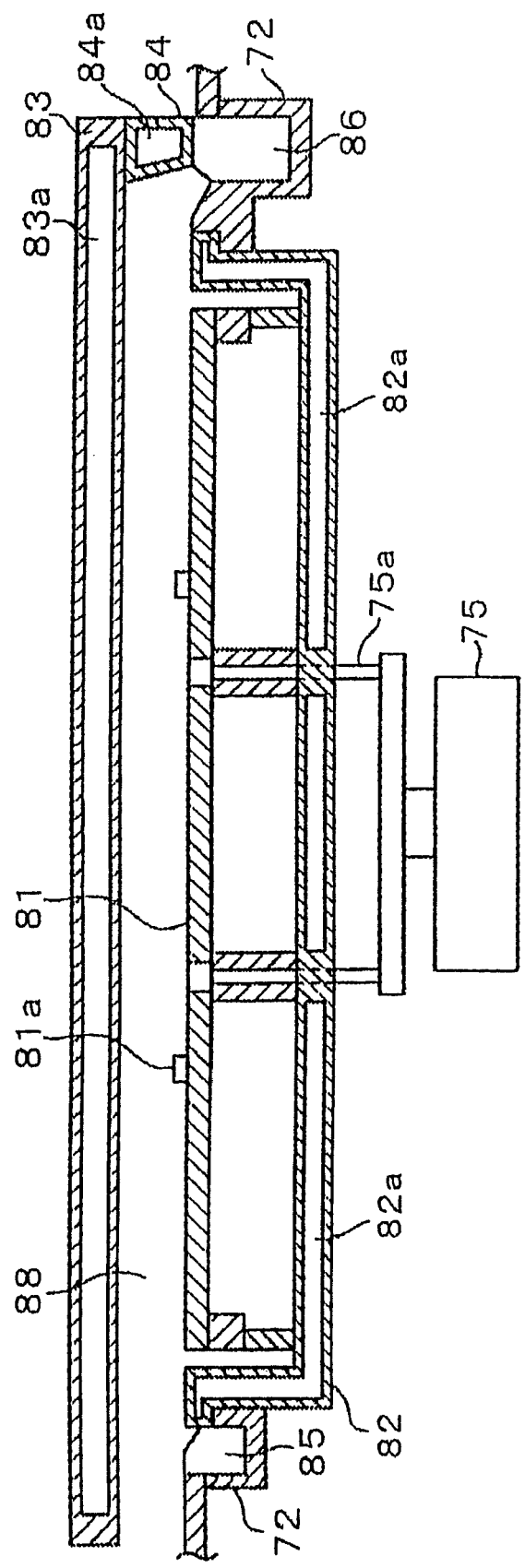
FIG. 12 is a vertical cross-sectional view showing the detailed structure of a hot plate, a top plate and relevant component parts of the heating apparatus of FIG. 10.
Figure 13:
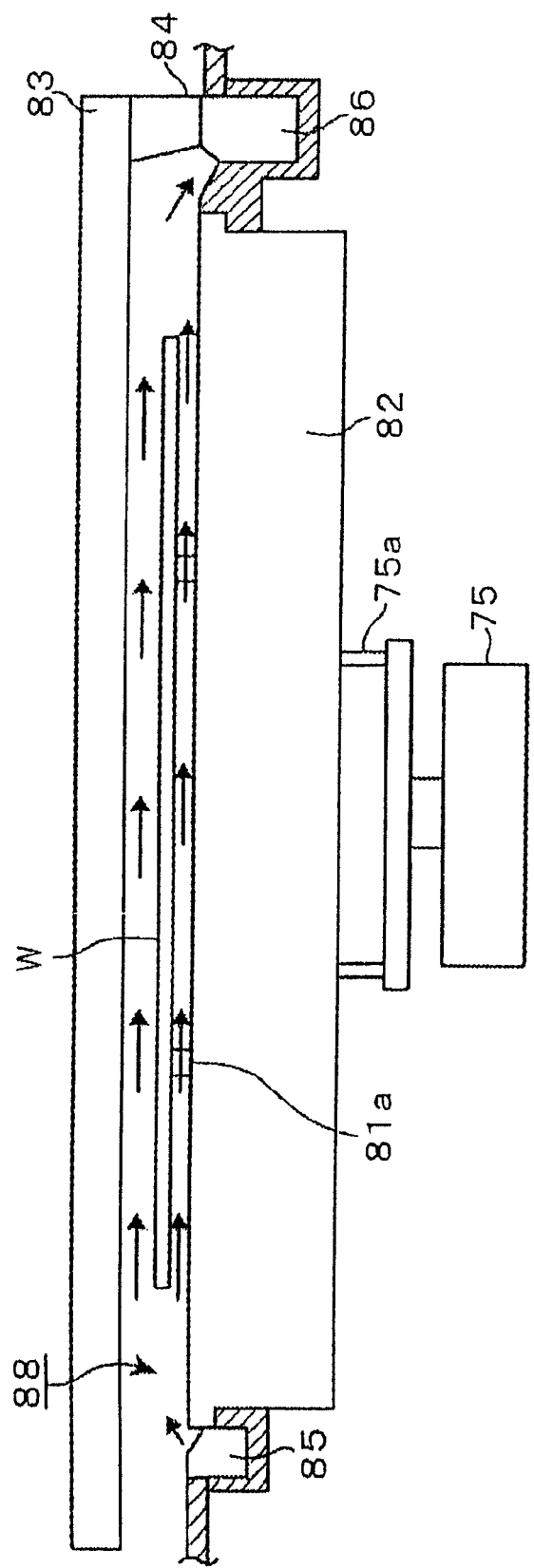
FIG. 13 is an illustration showing an air (gas) flow flowing through a space between the hot plate and the top plate of the heating apparatus of FIG. 10.

As shown in FIG. 11, a gas jetting unit 85 and a gas suctioning unit 86 are disposed on both sides of the hot plate 81, and horizontally extend parallel with each other in Y-directions (i.e., the width direction of the casing 70). The jetting unit 85 has a plurality of gas jetting holes 85a arrayed in Y-direction, and the suctioning unit 86 has a plurality of gas suctioning holes 85a arrayed in Y-direction. When the wafer W is heated by the hot plate 11, the gas jetting holes 85a jet a purging gas toward the lower surface of the top plate 83, while the purging gas is sucked from the space between the hot plate 81 and the top plate 83 through the gas suctioning holes 85a. Thus, the wafer W is entirely covered by a unidirectional flow (indicated by arrows in FIG. 13) of the purging gas, whose width with respect to Y-direction is greater than that of the wafer W, and which flows from the one side of the wafer W to the other side of the wafer.

The embodiment of FIGS. 10 to 13 achieves essentially the same advantages those achieved by the embodiment of FIGS. 1 to 9, due to the provision of the heat-insulating vacuum chamber (layer) 83a in the top plate 83.

It should be noted that the gas jetting holes 85a are not absolutely necessary for generating the wide unidirectional flow. In one modification, the space 88 between the hot plate 81 and the top plate 83 may be surrounded by a wall having an opening on the cooling plate (73) side, thereby forming a semi-closed cavity in which the wafer W is accommodated. In this case, a unidirectional flow can be generated in the cavity by sucking the same through the gas suctioning holes 86a, without jetting a gas from the gas jetting holes 85a.

An embodiment of a resist pattern forming system, or a coating and developing system, employing the heating apparatus 2 will be described with reference to FIGS. 14 to 16. The resist pattern forming system includes a carrier block S1, a processing block S2, an interface block S3 and an exposing apparatus S4. A carrier 90 that accommodates therein a plurality of, e.g., thirteen wafers W in an air-tight fashion is loaded into the carrier block S1 and unloaded therefrom. The processing block S2 has a multi-layered construction, in other words, the processing block S2 is constituted by vertically arranging a plurality of, e.g., five sub-blocks B1 to B5.

The carrier block S1 includes a mounting table 91 for mounting thereon the plurality of carriers 90, a gate 92 formed in a front wall surface which is opposed to the mounting table 91, and a transfer arm C for taking the wafer W out of the carrier 90 through the gate 92. The transfer arm C can move forward and rearward, move in vertical directions, rotate about a vertical axis, and move in directions in which the carriers 90 are arrayed, so that the wafer W can be transferred between a transfer stage TRS 1 of the sub-block B1 and a transfer stage TRS 2 of the sub-block B2, which will be described later.

The processing block S2 surrounded by a housing 93 is connected to the backside of the carrier block S1. In the illustrated embodiment, the processing block S2 includes the first to fifth sub-blocks B1 to B5, as shown in FIG. 15. The lowermost and next to the lowermost sub-blocks are the first and the second sub-blocks (DEV layers) B1 and B2 adapted to develop the wafer W. The third sub-block (TCT layer) B3 is adapted to form an anti-reflection film on an upper surface of a resist film. The fourth sub-block (COT layer) B4 is adapted to coat the wafer W with a resist solution. The fifth sub-block (BCT layer) B5 is adapted to form an anti-reflection film on which the resist film is formed. The DEV layers B1 and B2 correspond to the sub-blocks for carrying out a developing process, while the TCT layer B3, the COT layer B4, and the BCT layer B5 correspond to the sub-blocks for carrying out a coating film forming process.

The structure of the first to fifth sub-blocks B (B1 to B5) will be described below. The sub-blocks B1 to B5 are respectively provided with liquid processing units for coating the wafer W with a chemical liquid, various heating and cooling units for processing the wafer W before or after the wafer W is processed by the liquid processing unit, and main arms A1 to A5 that transfers the wafer W among the above units.

The sub-block B will be described, taking the COT layer B4 shown in FIG. 14 as an example. Provided in the central part of the COT layer B4 is a wafer conveying area R1, which extends in the longitudinal direction (Y-direction in the drawings) of the COT layer B4 to connect the carrier block S1 and the interface block S3 to each other.

Figure 14:
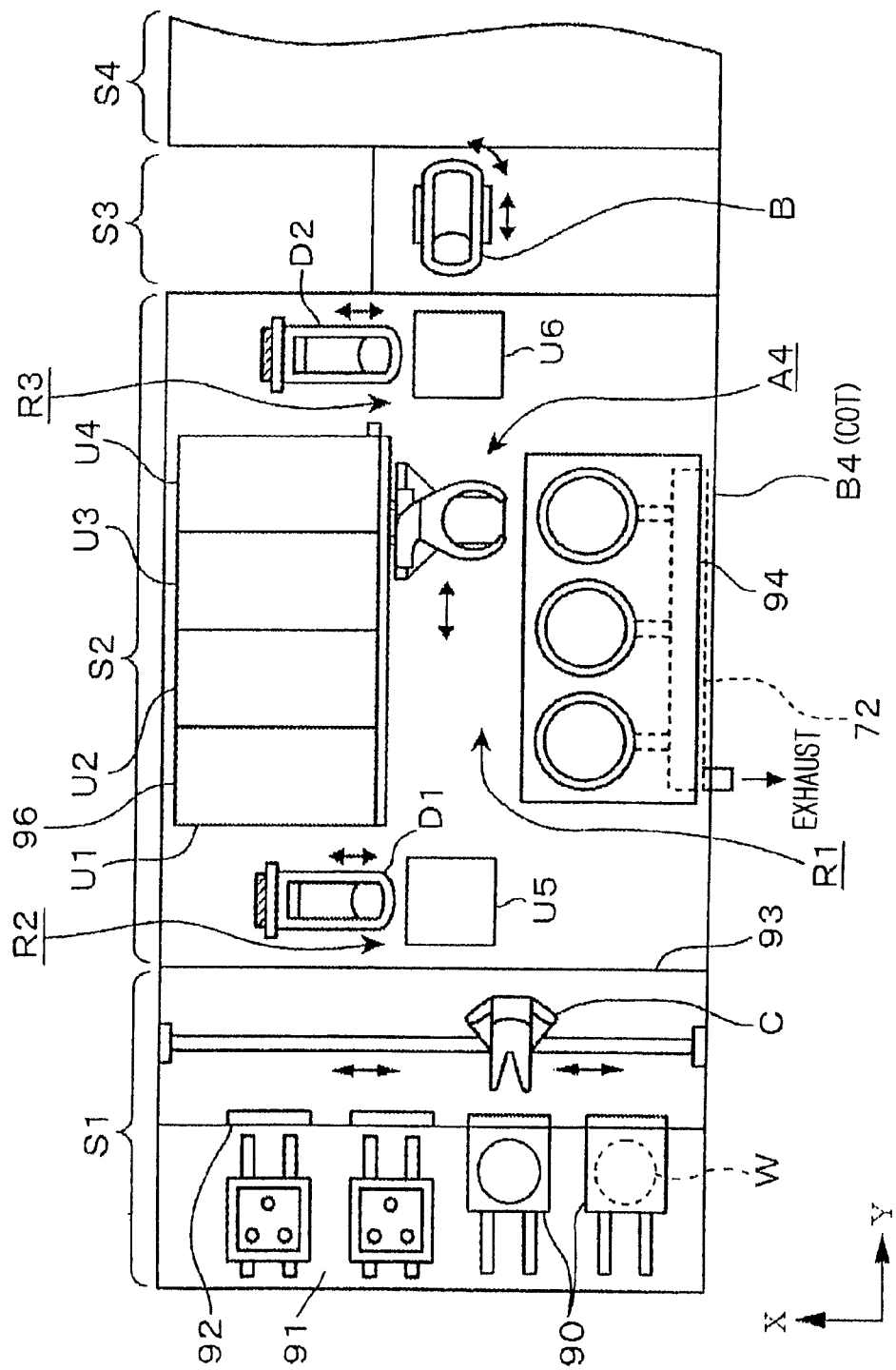
FIG. 14 is a top plan view of a coating and developing system employing the heating apparatus of FIG. 1.
Figure 15:
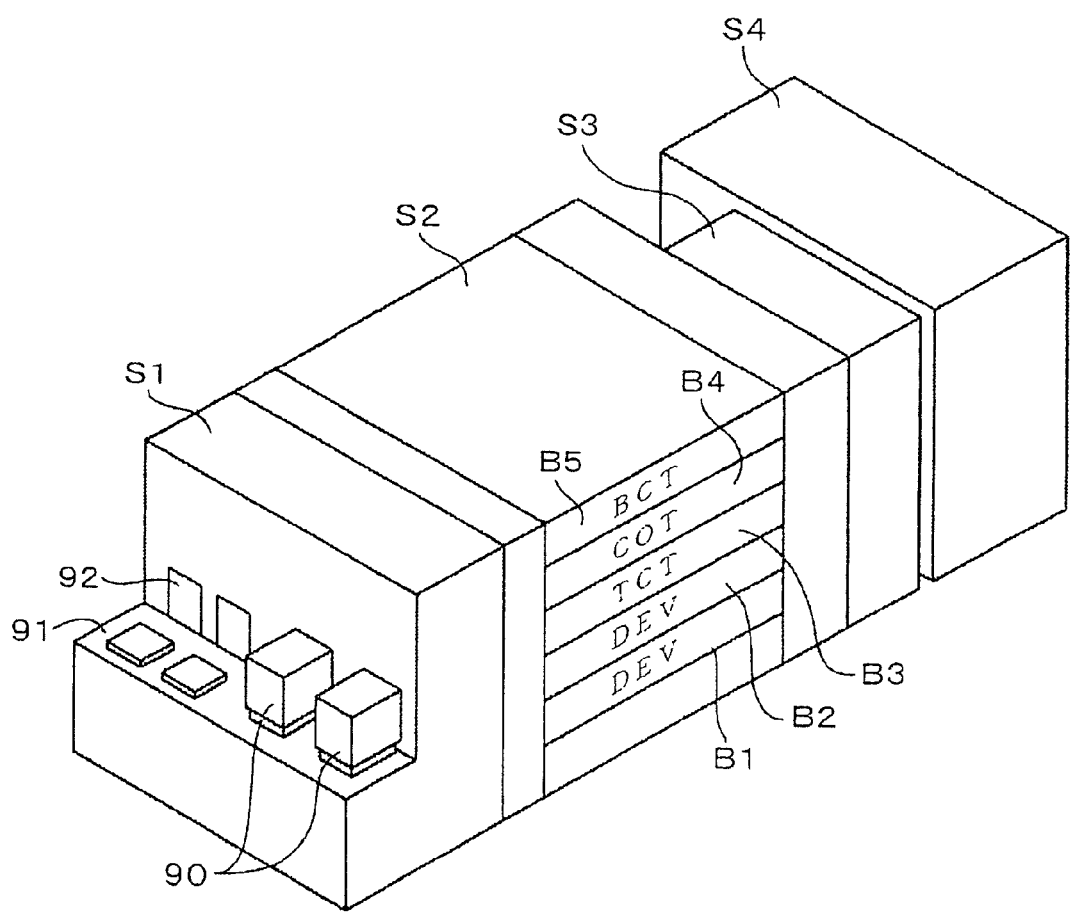
FIG. 15 is a perspective view of the coating and developing system of FIG. 14.

As viewed from the carrier block S1, the COT layer B4 is provided with a coating unit 94 on the right side, and four unit-stacks U1 to U4 arrayed in that order on the left side (see FIG. 14). The coating unit 94 including a plurality of coating devices for coating the wafer W with a resist solution is disposed in the conveying area R. Each of the unit-stacks U1 to U4 includes stacked heating or cooling units. In the illustrated embodiment, each of the unit-stacks U1 to U4 has two units, one for carrying out a pre-treatment before a coating process by the coating unit 94 and the other for carrying out an after-treatment after the coating process by the coating unit 94.

The above-described units for carrying out the pre-treatment and the after-treatment of the wafer W include a cooling unit (COL) for adjusting the temperature of the wafer W before the wafer W is coated with the resist solution, a heating unit (CHP) 95 called "pre-baking unit" for heating the wafer W after the wafer W is coated with the resist solution, and a peripheral exposing unit (WEE) for exposing only an edge part of the wafer W. In this coating and developing system, the heating apparatus 2 having been described with reference to FIGS. 1 to 9 is used as the heating unit 95. These plural processing units such as the cooling unit (COL) and the heating unit (CHP) 95 are housed in individual casings 96 (processing vessels). Each of the unit-stacks U1 to U4 is constituted by stacking two of the casings 96. Each of the casings 96 has a transfer port 97 formed in a surface facing the transfer area R1. The wafer W is loaded into and unloaded from the casing 96 through the transfer port 97. In the illustrated embodiment, two of the heating units (CHP) 95 are stacked to form the unit-stack U3, and one of the heating units (CHP) 95 is included in the unit-stack U4 (see FIG. 17).

The main arm A4 is disposed in the conveying area R1. The main arm A4 is capable of moving forward and rearward, moving in vertical directions, rotating about a vertical axis, and moving in Y-directions, so that the main arm can transfer the wafer W among all the units in the COT layer B4, namely, the unit-stacks U1 to U4 and the coating unit 94, in addition to parts of unit-stacks U5 and U6 (which will be described later) arranged in the COT layer B4.

A region of the conveying area R1 adjacent to the carrier block S1 serves as a first wafer transfer area R2. As shown in FIGS. 14 and 16, the unit-stack U5 is arranged at a position where both the transfer arm C and the main arm A4 can access. The first wafer transfer area R2 is provided with a first transfer arm D1 that transfers the wafer W to and from the unit-stack U5.

Figure 16:
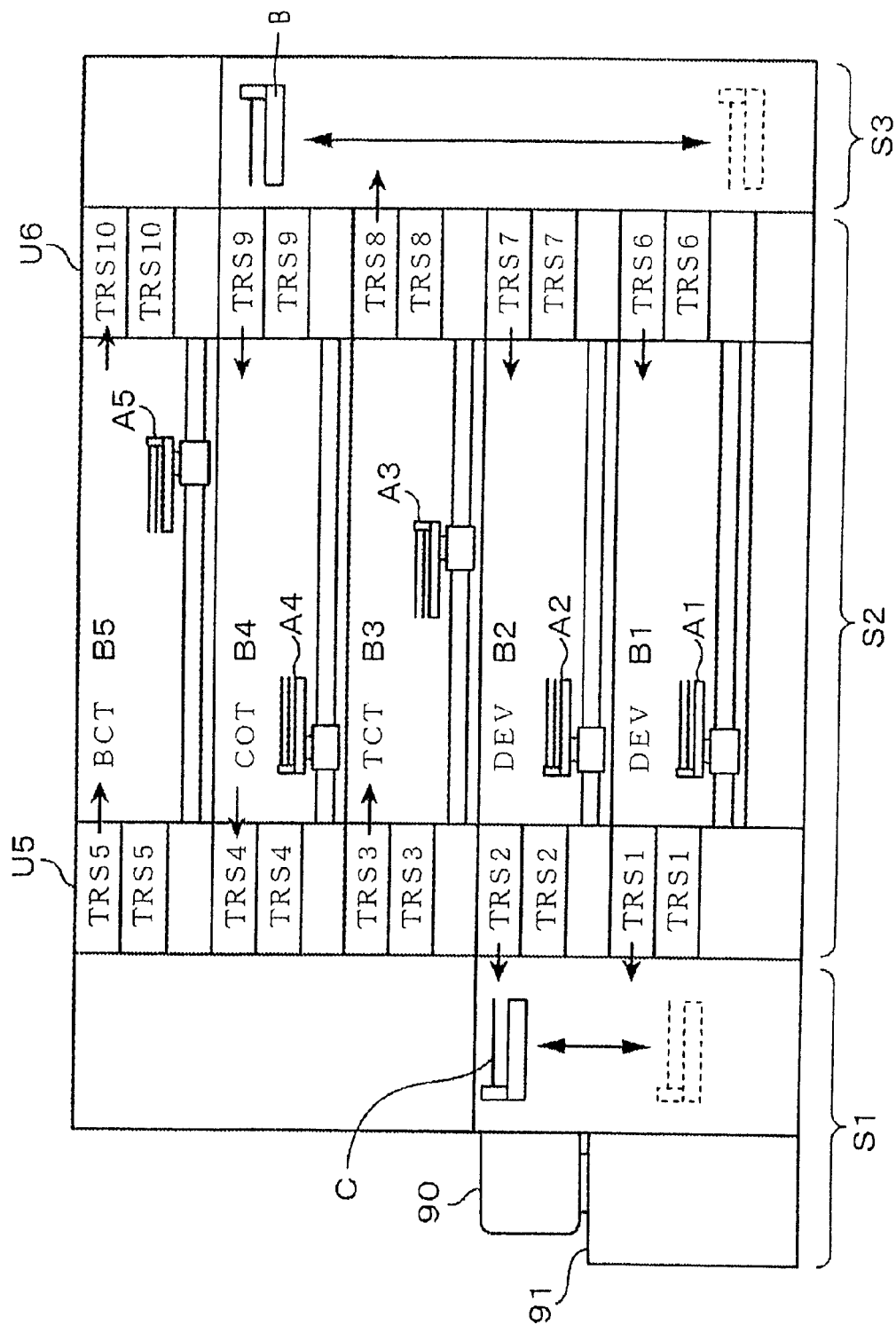
FIG. 16 is a longitudinal, vertical cross-sectional view of the coating and developing system of FIG. 14.

As shown in FIG. 16, the unit-stack U5 includes a plurality of first transfer stages TRS 1 to TRS 5. More than one (in the illustrated embodiment, two) first transfer stages (TRS 1 to TRS 5) are assigned to each of the sub-blocks B1 to B5, and can be accessed by the main arm (A1 to A5) assigned to each of the sub-blocks B1 to B5 to transfer the wafer W. The first transfer arm D1 can move forward and rearward and move in vertical directions so as to transfer the wafer W among the first transfer stages TRS1 to TRS5. In the illustrated embodiment, the transfer arm C is accessible to the first transfer stages TRS1 of the first sub-block B1 and the first transfer stages TRS2 of the second sub-block B2 so as to transfer the wafer W between the carrier block S1 and the processing block S2.

A region of the conveying area R1 adjacent to the interface block S3 serves as a second wafer transfer area R3. As shown in FIG. 14, the unit-stack U6 is arranged at a position where the main arm A4 can access. The first wafer transfer area R2 is provided with a first transfer arm D2 that transfers the wafer W to and from the unit-stack U6.

As shown in FIG. 16, the unit-stack U6 includes a plurality of first transfer stages TRS 6 to TRS 10. More than one (in the illustrated embodiment, two) first transfer stages (TRS 6 to TRS 10) are assigned to each of the sub-blocks B1 to B5, and can be accessed by the main arm (A1 to A5) assigned to each of the sub-blocks B1 to B5 to transfer the wafer W. The second transfer arm D2 can move forward and rearward and move in vertical directions so as to transfer the wafer W among the second transfer stages TRS6 to TRS10. In the illustrated embodiment, the wafer W can be transferred among the five sub-blocks B1 to B5 arranged at five different levels by means of the first and second transfer arms D1 and D2 via the first transfer stages TRS1 to TRS5 and the second transfer stages TRS6 to TRS 10.

The other sub-blocks (layers) B1 to B3, and B5 and B6 will be briefly described below. The DEV layers B1 and B2 have the same structure, and each includes a developing unit having a plurality of developing devices for developing the wafer W. Each of the unit-stacks U1 to U4 of the DEV layers B1 and B2 includes a heating unit (PEB) called "post-exposure baking unit" for heating the exposed wafer W, a cooling unit (COL) for adjusting the temperature of the wafer W after the wafer W is processed by the heating unit (PEB), and a heating unit (POST) called "post-baking unit" for heating the developed wafer W to remove moisture therefrom. Apart from what mentioned above, each of the DEV layers B1 and B2 has the same structure as that of the COT layer B4. The heating units arranged in the DEV layers B1 and B2 have the same structure as that of the heating unit 95 of the COT layer B4, but the former is different from the latter only in the process temperature and the process time period.

In the DEV layer 61, the wafer W is transferred by the main arm A1 among the first transfer stages TRS1, the second transfer stages TRS6, the developing unit, and the processing units included in the unit-stacks U1 to U4. In the DEV layer B2, the wafer W is transferred by the main arm A2 among the first transfer stages TRS2, the second transfer stages TRS7, the developing unit, and the processing units included in the unit-stacks U1 to U4.

The TCT layer B3 is provided with a second anti-reflection film forming unit having a plurality of second anti-reflection film forming devices, and coats the wafer W, having been coated with a resist, with a chemical liquid to form a second anti-reflection film on the wafer W. Unit-stacks U1 to U4 of the TCT layer B3 have the same structures as those of the unit-stacks U1 to U4 of the COT layer B4, except that the former include a cooling unit (COL) for adjusting the temperature of the wafer W before forming an anti-reflection film thereon, and a heating unit (CHP) for heating the wafer W after forming the anti-reflection film thereon. The heating unit (CHP) has the same structure as that of the heating unit 95 of the COT layer B4, except only for a process temperature and a process time period. In the TCT layer B3, the wafer W is transferred by the main arm A3 among the first transfer stages TRS3, the second transfer stages TRS 8, the second anti-reflection film forming unit, and the processing units included in the unit-stacks U1 to U4.

The BCT layer B5 is provided with a first anti-reflection film forming unit having a plurality of first anti-reflection film forming devices, and coats the wafer W with a chemical liquid to form a first anti-reflection film on the wafer W before coating the wafer W with the resist solution. Unit-stacks U1 to U4 of the BCT layer have the same structures as those of the unit-stacks U1 to U4 of the COT layer B4, except that the former include a cooling unit (COL) for adjusting a temperature of the wafer W before forming thereon an anti-reflection film, and a heating unit (CHP) for heating the wafer W after forming thereon the anti-reflection film, and do not have a peripheral exposing unit (WEE). The heating unit (CHP) has the same structure as that of the heating unit 95 of the COT layer B4, except only for a process temperature and a process time period. In the fifth sub-block B5, the wafer W is transferred by the main arm A5 among the first transfer stages TRS5, the second transfer stages TRS10, the first anti-reflection film forming unit, and the processing units included in the unit-stacks U1 to U4.

The units included in the unit-stacks U1 to U4 are not limited to the heating units (CHP, PEB, POST), the cooling unit (COL), and the peripheral exposing unit (WEE), and may be of another sort of unit. In practice, the number of units is determined, taking the process time period required for the respective units into consideration.

An exposing apparatus S4 is connected to the processing block S2 on the side of the unit-stack 6 through the interface block S3. The interface block S3 is provided with an interface arm B for transferring the wafer W between the unit-stack U6 of the processing block S2 and the exposing apparatus S4. In the illustrated embodiment, the interface arm B can move forward and rearward, move in vertical directions, and rotate about a vertical axis, so as to transfer the wafer W to and from the second transfer stages TRS6 to TRS9 of the first to fourth sub-blocks B1 to B4. The second transfer stages TRS6 to TRS9 serve as transfer stages for the interface block S3.

Alternatively, the interface arm B may be configured so that it transfers the wafer W to and from the second transfer stages TRS6 to TRS10 of the respective sub-blocks B1 to B5. In this case, the second transfer stages TRS6 to TRS10 serve as transfer stages for the interface block.

The main arm A (A1 to A5) will be described, taking the main arm A4 of the COT layer B4 as an example. As shown in FIG. 17, the main arm A4 is provided with two carrying arms 201 and 202 for supporting a peripheral area of the back surface of the wafer W. The carrying arms 201 and 202 can move forward and rearward independently from each other along an arm carrier 203. The arm carrier 203 is capable of rotating about a vertical axis by means of a rotation mechanism 204. The arm carrier 203 is also capable of moving, by a moving mechanism 205, in Y-directions along a Y-axis rail 207, and is capable of moving in vertical directions along a vertical rail 208. The Y-axis rail 207 is attached to a surface of a base 206 facing the transfer area R1, which base 206 supports the unit-stacks U1 to U4 thereon. Thus, the carrying arms 201 and 202 can move forward and rearward, move in Y-directions, move in vertical directions, and rotate about a vertical axis. Each of the main arms A1 to A3 and A5 has a similar structure as that of the main arm A4. Thus the main arms A1 to A6 are capable of transfer the wafer W in the respective layers (i.e., sub-blocks) among the units included in the unit-stacks U1 to U6, the first and the second transfer stages (TRS1 to TRS10), and the liquid processing units.

In the COT layer B4, the wafer W is transferred by the main arm A4 to the heating unit through its transfer port 97. After the wafer W coated with the resist solution is baked, the wafer W is transferred outside the heating unit 95 by the main arm A4.

The flow of the wafer W in the resist pattern forming apparatus will be describe below, where the anti-reflection films are formed on both upper and lower surfaces of a resist film. A carrier 90 is loaded into the carrier block S1 from outside. A wafer W is taken out from the carrier 90 by the transfer arm C. The wafer W is transferred from the transfer arm C to the transfer stage TRS2 of the unit-stack U5 assigned to the second sub-block B2. The first transfer arm D1 transfers the wafer W from the transfer stage TRS2 to the transfer stage TRS5 assigned to the BCT layer B5, and then the main arm A5 of the BCT layer B5 receives the wafer W. Thereafter, in the BCT layer B5, the wafer W is transferred by the main arm A5 to the cooling unit (COL), the first anti-reflection film forming unit, the heating unit (CHP), and the transfer stage TRS10 of the unit-stack U6, in that order. Thus, a first anti-reflection film is formed on the wafer W.

Subsequently, the wafer W on the transfer stage TRS10 assigned to the BCT layer B5 is transferred by the second transfer arm D2 to the transfer stage TRS9 assigned to the COT layer B4, and then to the main arm A4 of the COT layer B4. In the COT layer 4, the wafer W is transferred by the main arm A4 to the cooling unit (COL), the coating unit 94, the heating unit (CHP) 95, and the transfer stage TRS4, in that order. Thus, a resist film is formed on the first anti-reflection film.

Next, the wafer W on the transfer stage TRS4 assigned to the COT layer 4 is transferred by the first transfer arm D1 to the transfer stage TRS3 assigned to the TCT layer B3, and then to the main arm A3 of the TCT layer B3. In the TCT layer B3, the wafer W is transferred by the main arm A3 to the cooling unit (COL), the second anti-reflection film forming unit, the heating unit (CHP), the peripheral exposing unit (WEE), and the transfer stage TRS8 of the unit-stack U6, in that order. Thus, a second anti-reflection film is formed on the resist film.

At last, the wafer W on the transfer stage TRS 8 assigned to the TCT layer B3 is transferred by the interface arm B to the exposing apparatus S4 where the wafer W is subjected to a predetermined exposure process. After the wafer W is exposed, the exposed wafer W is transferred by the interface arm B to the transfer stage TRS6 (or TRS7) of the unit-stack U6 assigned to the DEV layer B1 (or DEV layer B2). The wafer W on the stage TRS6 (or TRS7) is picked up by the main arm A1 (or main arm A2) of the DEV layer B1 (or DEV layer B2). In the DEV layer B1 (or DEV layer B2), the wafer W is transferred to the heating unit (PEB), the cooling unit (COL), the developing unit, and the heating unit (POST), in that order. Thus, the wafer W is subjected to a predetermined developing process. The developed wafer W is transferred to the transfer stage TRS1 (or TRS2) and then to the transfer arm C. Finally, the wafer W is returned by the transfer arm C to the original carrier 90 placed on the carrier block S1.

When the heating apparatus according to the present invention is applied as a baking unit in a coating and developing apparatus, the vacuum insulating layer 65 in the top plate 6 prevents generation of disturbed flow which may be caused when the wafer W is heated. As a result, a wafer W, having been coated with a coating solution such as a resist solution or a chemical liquid for an anti-reflection film, can be heat treated with a high, in-plane uniformity in the respective blocks B3 to B5, and thus a satisfactory resist pattern can be formed on the wafer W.

Not limited to a coating and developing apparatus for forming a resist film on a substrate, the heating apparatus 2 can be applied to an insulation film forming apparatus that coats a substrate with a liquid precursor of an insulation film and heats the liquid precursor to form an insulation film on the substrate.

What is claimed is:

1. A substrate heating method comprising:
   heating a top plate by a hot plate, the top plate being arranged above the hot plate so that a vertical space is formed between the hot plate and the top plate, the top plate having an evacuated internal chamber serving as a vacuum insulating layer;
   placing a substrate, coated with a coating solution, on the hot plate; and
   heating the substrate to heat the coating solution, while generating a gas flow flowing through the space between the hot plate and the top plate.

2. The method according to claim 1, wherein the generating of the gas flow is performed by sucking a gas from the space between the hot plate and the top plate through a suctioning port arranged in the top plate and opening into the space between the hot plate and the top plate at a center of the top plate, whereby the gas flow flows below the top plate from a peripheral portion of the substrate toward a central portion of the substrate.

3. The method according to claim 1, wherein a heat-insulating member is arranged below the hot plate so as to cover the hot plate, the heat-insulating member having an evacuated internal chamber serving as a vacuum insulating layer.

4. The method according to claim 1, wherein the generating of the gas flow is performed by jetting a gas from a first side of the hot plate while sucking the gas thus jetted from a second side of the hot plate opposite to the first side to generate an unidirectional gas flow, having a width covering a width of the wafer, flowing through the space between the hot plate and the top plate from the first side toward the second side.

5. The method according to claim 1, wherein a heat-insulating member is arranged below the hot plate so as to cover the hot plate, the heat-insulating member having an evacuated internal chamber serving as a vacuum insulating layer.

6. The method according to claim 5, wherein the heat-insulating member is a low-profile, cylindrical member having a bottom, whereby a space is bounded below the hot plate by the hot plate and the cylindrical member.

7. The method according to claim 1 further comprising:
   supplying a cooling gas into the space below the hot plate to cool the hot plate, after the substrate having been heated is removed from the hot plate and before another substrate is placed on the hot plate.

8. The method according to claim 6, wherein the placing of the wafer is performed by raising or lowering a substrate lifting member extending vertically through the heat-insulating member, by means of a drive unit arranged below the hot plate and the heat-insulating member such that, as viewed in a vertical direction, the drive unit is located within an area defined by a periphery of the hot plate.

9. The method according to claim 5 further comprising:
   supplying a cooling gas into the space below the hot plate to cool the hot plate, after the substrate having been heated is removed from the hot plate and before another substrate is placed on the hot plate.

10. The method according to claim 5, wherein the placing of the wafer is performed by raising or lowering a substrate lifting member extending vertically through the heat-insulating member, by means of a drive unit arranged below the hot plate and the heat-insulating member such that, as viewed in a vertical direction, the drive unit is located within an area defined by a periphery of the hot plate.

* * * * *